United States Patent [19]

Terada et al.

[11] Patent Number: 5,347,490
[45] Date of Patent: Sep. 13, 1994

[54] NONVOLATILE SEMICONDUCTOR MEMORY DEVICE

[75] Inventors: Yasushi Terada; Takeshi Nakayama; Shinichi Kobayashi; Yoshikazu Miyawaki; Masanori Hayashikoshi, all of Hyogo, Japan

[73] Assignee: Mitsubishi Denki Kabushiki Kaisha, Tokyo, Japan

[21] Appl. No.: 711,532

[22] Filed: Jun. 10, 1991

[30] Foreign Application Priority Data

Jun. 15, 1990 [JP] Japan ................... 2-158361

[51] Int. Cl.$^5$ ............................................. G11C 11/34
[52] U.S. Cl. ..................... 365/219; 365/185
[58] Field of Search ................. 365/219, 185

[56] References Cited

U.S. PATENT DOCUMENTS

| | | | |
|---|---|---|---|
| 4,977,541 | 12/1990 | Tabouriech | 365/185 |
| 5,077,691 | 12/1991 | Haddad et al. | 365/185 |
| 5,095,461 | 3/1992 | Miyakawa et al. | 365/185 |
| 5,097,444 | 3/1992 | Fong | 365/185 |
| 5,132,935 | 7/1992 | Ashmore, Jr. | 365/185 |
| 5,142,495 | 8/1992 | Canepa | 365/185 |
| 5,153,854 | 10/1992 | Herold | 365/185 |

FOREIGN PATENT DOCUMENTS

| | | | |
|---|---|---|---|
| 0113195 | 5/1986 | Japan | 365/185 |
| 0059697 | 3/1989 | Japan | 365/185 |

OTHER PUBLICATIONS

A 90-ns One-Million Erase/Program Cycle 1-Mbit Flash Memory, Kynett et al. IEEE Journal of Solid State Circuits vol. 24, No. 5, Oct. 1989.

ISSCC 90/Wednesday, Feb. 14, 1990/Imperial Ballroom/2:30 p.m. "Non-Volatile and Fast Static Memories" Seki et al.

Subbreakdown Drain Leakage Current in MOSFET Chen et al. IEEE Electron Device Letters EDL-8, No. 11, Nov. 1987 pp. 515-517.

A Flash-Erase EEPROM Cell with an Asymmetric Source and Drain Structure, Kune et al. Central Research Laboratory, Hitachi IEEE/IEDM 1987 pp. 560-563.

*Primary Examiner*—Margaret R. Wambach
*Attorney, Agent, or Firm*—Lowe, Price, LeBlanc & Becker

[57] ABSTRACT

Disclosed is a flash EEPROM including a voltage lowering circuit therein for lowering an externally applied high voltage serving as a source of an erase pulse to a predetermined voltage in a range in which a tunnel phenomenon sufficiently occurs in memory cells. The voltage lowered by the voltage lowering circuit is converted into a pulse of a small width, and the converted pulse is then applied as an erase pulse to the memory cells. A flash EEPROM including a memory cell array divided into first and second blocks is also disclosed. An erase pulse applying circuit for applying the voltage lowered by the voltage lowering circuit as an erase pulse to the memory cells, and an erase verify circuit for erase verifying are provided for each of the first and second blocks. The erase pulse applying circuit and the erase verify circuit corresponding to the first block and the ones corresponding to the second block are configured to operate independently.

36 Claims, 7 Drawing Sheets

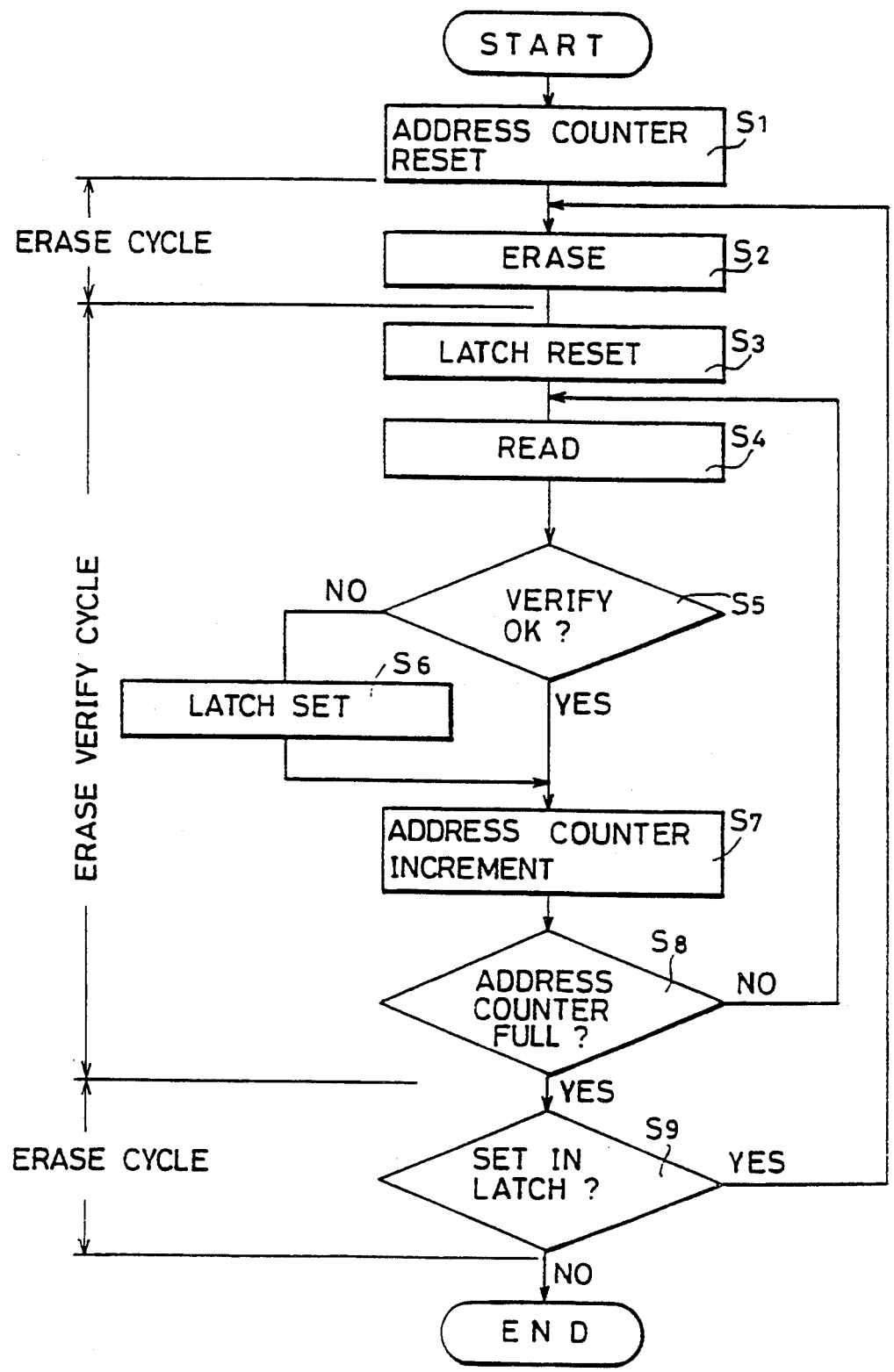

NONVOLATILE SEMICONDUCTOR MEMORY DEVICE

BACKGROUND OF THE INVENTION

1. Field of the Invention

The present invention relates generally to nonvolatile semiconductor memory devices and, more particularly, to a nonvolatile semiconductor memory device in which data can electrically be written and erased.

2. Description of the Background Art

There are two types of semiconductor memory devices: the one is a volatile memory such as a DRAM (Dynamic Random Access Memory), an SRAM (Static Random Access Memory) and the like, and the other is a nonvolatile memory. Storage data of a volatile memory are all erased when a power supply is OFF. Storage data of a nonvolatile memory are, however, not erased even if the power supply is OFF. As a representative of nonvolatile semiconductor memory devices, there is a PROM (programmable read only memory). The PROM is a semiconductor memory device in which information is written by a user. As one type of the PROM, there is an EEPROM (electrically erasable and programmable ROM) in which written information can electrically be erased so that information can be rewritten any times. An EEPROM in which storage data of all memory cells can be erased in block is called a flash EEPROM.

FIG. 7 is a schematic block diagram showing a fundamental structure of a conventional flash EEPROM. With reference to FIG. 7, the flash EEPROM includes a memory array 1, a row decoder 60, a Y gate 70 and a column decoder 80.

Memory array 1 includes a plurality of memory cells MC arranged in matrix in the directions of rows and columns. Each of memory cells MC is connected to a corresponding bit line 30 and a corresponding word line 50 in memory array 1. A FAMOS (floating-gate avalanche injection MOS) transistor capable of storing charges in a floating gate is employed in each memory cell MC.

FIG. 8 is a cross-sectional view showing structure of a FAMOS transistor. With reference to FIG. 8, the FAMOS transistor includes a control gate 200, a floating gate 210, N type regions 220 and 230 formed on a P type substrate 240, and an insulator layer 250. Floating gate 210 is formed on P type substrate 240 to bridge N type regions 220 and 230, with insulator layer 250 interposed therebetween. Control gate 200 is formed on floating gate 210 with insulator layer 250 interposed therebetween. Control gate 200 and floating gate 210 are both formed of polysilicon. Insulator layer 250 is formed, of an oxide film such as SiO₂ or the like. Oxide film 250 formed between P type substrate 240 and floating gate 210 has such a small thickness as of normally approximately 100 Å. Control gate 200 is connected to a corresponding word line 50 in FIG. 7. The one N type region 220 of the two N type regions is connected as a drain of this MOS transistor to a corresponding bit line 30 in FIG. 7. The other N type region 230 is connected as a source of the MOS transistor to a source line 80 which is common to all memory cells MC in FIG. 7. P type substrate 240 is grounded.

In data writing, high voltage pulses of 12V or less are applied to control gate 200 and drain 220 via word line 50 and bit line 30, respectively. Source 230 is grounded via source line 80. When the high voltage pulses are applied to drain 220, and source 230 is grounded, avalanche breakdown is caused. Free electrons (hot electrons) ⊖ having high energy and holes ⊕ corresponding to these electrons are generated in a depletion layer in the vicinity of drain 220. The holes ⊕ flow toward grounded P type substrate 240. Since the high voltage pulses are also applied to control gate 200, the hot electrons ⊖ are accelerated by an electric field from control gate 200 and then injected into floating gate through thin oxide film 250 formed between floating gate 210 and P type substrate 240.

The electrons injected into floating gate 220 cannot escape therefrom because floating gate 210 is electrically insulated by oxide film 250. Thus, the electrons once injected into floating gate 210 do not leak out from floating gate 210 but stored therein for a long time even after a power supply is cut off. The state where the electrons are stored in floating gate 210 corresponds to data "0", and the state where no electrons are stored in floating gate 210 corresponds to data "1". Therefore, storage data of memory cells MC are held even after the power supply is cut off. If the electrons are stored in floating gate 210, an inversion layer is not easily produced between source 230 and drain 220 (, i.e., a channel region) due to the stored electrons. Thus, if the electrons are stored in floating gate 210, a gate voltage which is required to produce a channel in this MOS transistor (a threshold voltage of this transistor) is raised higher than the gate voltage which is required when no electrons are stored in floating gate 210. That is, no inversion layer is produced in the channel region unless control gate 200 is supplied with a higher voltage than the voltage enabling an inversion layer to be formed in the channel region when no electrons are stored in floating gate 210.

In erasing of the storage data, a high voltage is applied to source 230 via a source line 28, and control gate 200 is grounded via word line 50. This causes a high electric field having a higher potential on source 230 to be applied to a portion between floating gate 210 and source 230. As a result, a tunnel phenomenon occurs in oxide film 250 insulating floating gate 210 and source 230 from each other, so that a current (tunnel current) flows between floating gate 210 and source 230. That is, the electrons leak out from floating gate 210 to source 230 through oxide film 250. Accordingly, the electrons stored in floating gate 210 are removed, so that the threshold voltage of the MOS transistor is lowered. Since source line 28 is commonly connected to respective sources of memory cells MC, as shown in FIG. 7, the storage data of all memory cells MC in memory array 1 are erased in block.

In data reading, control gate 200 and drain 220 are supplied with a supply voltage (normally 5V) and, a voltage relatively close to the supply voltage via corresponding word line 50 and bit line 30, respectively. Source 230 is grounded via source line 28. If no electrons are stored in floating gate 210 (i.e., if storage data is "1"), the threshold voltage of the MOS transistor is low, so that a channel is produced between source 230 and drain 220 in response to the supply voltage applied to control gate 200. If the electrons are stored in floating gate 210 (i.e., if storage data is "0"), however, the threshold voltage of the MOS transistor is high, so that no channel occurs between source 230 and drain 220 even if the supply voltage is applied to control gate 200. Accordingly, the MOS transistor constituting the memory cell, in which the storage data is "1", is turned on in data reading, so that a current flows from corresponding bit line 30 to source line 28. Since the MOS transistor constituting the memory cell, in which the storage data is "0", is in an OFF state even in data reading, no current flows from corresponding bit line 30 to source line 28. Thus, in data reading, a sense amplifier detects whether or not the current flows through a bit line corresponding to the memory cells from which data is to be read. A determination is made as to whether the storage data is "1" or "0", based on a result of this detection.

If a potential to be applied to bit line 30 in data reading is too high, a high electric field is applied to oxide film 250 formed between floating gate 210 and drain 220, and hence the electrons stored in floating gate 210 are drawn to the drain 220 side. Thus, the potential to be applied to bit line 30 is approximately 1-2V. Therefore, a small current flows through the memory cell, in which the storage data is "1" in data reading. Thus, a current sense amplifier is employed to detect this small current.

With reference to FIG. 7 again, address input terminals A0-AK receive an externally applied address signal. This address signal serves to instruct which one of memory cells MC in memory array 1 data is to be read from or written in. An address buffer 100 buffers an applied address signal to apply the buffered address signal to row decoder 60 and column decoder 80.

An input/output buffer 110 is connected to input/output terminals I/O$_0$-I/O$_N$ for receiving input data and output data. Input/output buffer 110 applies write data which is externally applied to input/output terminals I/O$_0$-I/O$_N$ to a write circuit 90. Further, input/output buffer 110 provides data supplied from a sense amplifier 120 to input/output terminals I/O$_0$-I/O$_N$ as read data.

Write circuit 90 supplies a voltage corresponding to the write data applied from input/output buffer 110 to Y gate 70. Sense amplifier 120 detects an output of Y gate 70 and, in response to a result of the detection, supplies a signal voltage corresponding to data "0" or "1" as read data to input/output buffer 110.

Row decoder 60 responds to the address signal from address buffer 100 to select one of word lines 50 in memory array 1. Column decoder 80 responds to the address signal from address buffer 110 to select one of bit lines 30 in memory array 1.

A control circuit 140 controls Y gate 70, column decoder 80, write circuit 90, address buffer 100, input/output buffer 110 and sense amplifier 120 so that they can perform an operation corresponding to each mode.

A terminal T$_{PP}$ is supplied with an external high voltage V$_{PP}$. A terminal T$_{CC}$ is supplied with an external supply voltage V$_{CC}$ of a normal level. A switch circuit 600 selectively outputs to predetermined circuitry one of the high voltage V$_{PP}$ and supply voltage V$_{CC}$ applied respectively to terminals T$_{PP}$ and T$_{CC}$.

Switch circuit 600 is controlled by control circuit 140 to supply the high voltage V$_{PP}$ from terminal T$_{PP}$ to row decoder 60 in data writing. Further, switch circuit 600 is controlled by control circuit 140 to apply the supply voltage V$_{CC}$ to row decoder 60 in data reading. Switch circuit 600 is further controlled by control circuit 140 to supply the high voltage V$_{PP}$ to a source line switch 150 in data erasing.

In data writing, Y gate 70 supplies the voltage applied from write circuit 90 to a bit line selected by column decoder 80. Specifically, if write data is "0", Y gate 70 supplies the high voltage V$_{PP}$ to the selected bit line. If the write data is "1", Y gate 70 holds a potential on the selected bit line at a ground potential. In data writing, row decoder 60 supplies the high voltage V$_{PP}$ from high voltage switch circuit 600 to a selected word line. In data writing, source line switch 150 applies the ground potential to source line 28. Therefore, if the write data is "0", the electrons generated by avalanche breakdown are injected only into floating gate 210 of a memory transistor (a selected memory transistor) located at the cross-over point between the word line selected by row decoder 60 and the bit line selected by column decoder 80. If the write data is "1", however, no electrons are injected into floating gate 210 since no high voltage is applied to the bit line in the selected memory transistor.

In data reading, row decoder 60 supplies a supply voltage V$_{CC}$ applied from switch circuit 600, which is lower than the above-described high voltage V$_{PP}$, to the selected word line. In data reading, Y gate 70 supplies a low voltage of 1-2V to the bit line selected by column decoder 80. In data reading, source line switch 150 applies a ground potential to source line 28 like the case in data writing. Accordingly, if storage data of the selected memory transistor is "1", a current flows from the selected bit line through drain 220, the channel region and source 230 of the selected memory cell to source line 28. If the storage data of the selected memory transistor is "0", the selected memory transistor is not turned on in response to a gate voltage of approximately 5V, so that no current flows through the selected bit line. Y gate 70 electrically connects only the selected bit line to sense amplifier 120. This enables sense amplifier 120 to detect whether the current flowing through the selected bit line exists or not.

In data erasing, Y gate 70 maintains all bit lines 30 in memory array 1 in a floating state. Row decoder 60 supplies a ground potential to all word lines 50 in memory array 1, in data erasing. Source line switch 150 converts the high voltage V$_{PP}$ applied from switch circuit 600 into a pulse signal, to apply the pulse signal to source line 28. Therefore, in data erasing, a tunnel phenomenon occurs in each of all memory cells MC in memory array 1, so that the electrons stored in floating gate 210 of the memory transistor, in which the storage data is "0", are removed from floating gate 210. Accordingly, when the data erasing is completed, the storage data of all memory cells MC in memory array 1 are "1".

It is assumed in the following description that the supply potential and the ground potential correspond to a logic high level (or the H level) and a logic low level (or the L level), respectively.

As described in the foregoing, in the EEPROM, data erasing is carried out by forcing the bending of an energy band between floating gate 210 and source 230 so as to make electrons to tunnel from floating gate 210 to source 230, with a high voltage applied between control gate 200 and source 230 of the memory transistor in data erasing. Thus, the amount of electrons drawn out from floating gate 210 varies depending on the magnitude of a high voltage to be applied to source line 28, the time period in which the high voltage is applied (i.e., the pulse width of high voltage pulses), the thickness of oxide film 250 existing between floating gate 210 and source 230, the thickness of oxide film 250 existing between floating gate 210 and control gate 200, and the like.

There are irregularities in manufacture of memory transistors constituting memory array 1. Because of the irregularities, the thickness of oxide film 250, the form of control gate 200 and floating gate 210, the length of the channel region, and the like are not completely uniformed in all memory transistors. It is actually difficult to simultaneously set the storage data of all memory cells MC in memory array 1 to "0" by the above-described collective erasing, due to the irregularities on manufacture of the memory transistors and other various factors such as some causes in actual circuit configurations. More specifically, in some of the memory transistors, in which the storage data is "0", only the stored electrons are completely removed from floating gate 210 in response to a high voltage applied in collective erasing, whereas in the other memory transistors, a larger amount of electrons than those stored in data writing are drawn out from floating gate 210 in response to the high voltage applied in collective erasing. The phenomenon of the latter case, in which the electrons are excessively drawn out from the floating gate, is called an excess erase.

When an excess erase occurs, floating gate 210 is charged to plus, so that an inversion layer is produced between source 230 and drain 220. This means that this memory transistor is in an ON state even if any potential of 0V or more is applied to control gate 200. As a result, in data reading, a current flows through a bit line corresponding to this memory transistor despite the fact that the transistor is in a non-selection state. Thus, if a memory cell connected to the bit line corresponding to the memory transistor subjected to the excess erase is selected, read data is "1" even in case where storage data of the selected memory transistor is "0". In data writing, if data "0" is intended to be written in the excess-erased memory cell or the memory cell connected to the same bit line as that of the excess-erased memory cell, electrons generated by avalanche breakdown in the selected memory cell leak as a channel current of the excess-erased memory cell to the bit line. Thus, electrons are not sufficiently injected into floating gate 210 of the selected memory cell. Accordingly, if the excessively erased memory cell exists, writing characteristics in data writing deteriorate, and further, data writing is disabled. As described above, the excess erase causes the polarity of the threshold value of the memory transistor to be inverted into minus to cause troubles in subsequent data reading and writing.

In order to prevent such an excess erase, the following method is adopted at present. That is, the pulse width of a high voltage pulse (hereinafter referred to as erase pulse) to be applied to source line 28 for data erasing is made smaller. Every time this erase pulse having the shorter pulse width is applied to source line 28 once, the storage data of all the memory cells in memory array 1 are read, so as to check whether or not all the storage data of memory cells MC in memory array 1 are "1". If there is even one memory cell in which the storage data is not "1", the erase pulse of the shorter pulse width is again applied to source line 28. The confirmation as to whether or not the storage data of the memory cells are "1" after the erase pulse is applied to source line 28, i.e., whether or not the storage data of the memory cells are completely erased, is called erase verifying. Such erase verification and such application of the erase pulse to source line 28 are repeated until the data erasing is completed with respect to all memory cells MC in memory array 1. A flash EEPROM in which excess erase is prevented by such a method is stated in, for example, *ISSCC Digest of Technical Papers* (1990), pp. 60–61 and *Electronic Information Communication Society Technical Research Papers* (May 21, 1990), pp. 73–77.

Incidentally, electrons are already injected into the floating gate of the memory cell transistor before the data erasing. Thus, the floating gate potential of the memory cell transistor is shifted to a negative side in data erasing. Accordingly, referring to FIG. 8, even if a voltage applied to source 230 in data erasing is approximately 12V, a very large electric field is actually induced at oxide film 250 formed between floating gate 210 and source 230. Thus, there is a case that even if a high voltage $V_{PP}$ for data erasing is applied as a pulse signal with a short pulse width of approximately 10 msec to source 230, electrons are excessively drawn out from floating gate 210 (excess erase). This phenomenon will now be described in more detail in the following.

FIG. 9 is an equivalent circuit diagram of a memory transistor representing a capacitance coupling relationship among a control gate 200, a floating gate 210, a drain 220, a source 230 and a substrate 240. Referring to FIG. 9, reference characters $C_{CF}$, $C_D$, $C_C$ and $C_S$ denote respective capacitances between control gate 200 and floating gate 210, between floating gate 210 and drain 220, between floating gate 210 and substrate 240 and between floating gate 210 and source 230, respectively. Accordingly, nodes N1, N2, N3, N4 and N5 correspond to control gate 200, floating gate 210, source 230, substrate 240 and drain 220; respectively. A potential on floating gate 210 (a potential on node N2) $V_{FG}$ is expressed by the following equation where $Q_{FG}$ denotes the amount of charge stored in floating gate 210; $V_G$, a potential applied to control gate 200; $V_D$, a potential of drain 220; $V_S$, a potential of source 230; and $V_C$, a potential of a channel region between drain 220 and source 230 (a corresponding portion of substrate 240 between drain 220 and source 230).

$$V_{FG} = \frac{V_G C_{CF} + V_D C_D + V_C C_C = V_S C_S + Q_{FG}}{C_{TOTAL}} \quad (1)$$

In the above equation, $C_{CF}$, $C_D$, $C_C$ and $C_S$ denote respective capacitance values of capacitors $C_{CF}$, $C_D$, $C_C$ and $C_S$ of FIG. 9. $C_{TOTAL}$ denotes a total of these capacitances; i.e., $C_{CF}+C_D+C_C+C_S$. A coupling ratio $k_C$ is defined by the following equation as a ratio of capacitance $C_{CF}$ between control gate 200 and floating gate 210 to total capacitance $C_{TOTAL}$ between control gate 200, floating gate 210, drain 220, source 230 and substrate 240.

$$k_C = C_{CF}/C_{TOTAL} \quad (2)$$

In addition, a variation $\Delta V_{TH}$ of a threshold value of this memory transistor viewed from control gate 200, which is caused by storage of electrons in flowing gate 210, is expressed by the following equation.

$$\Delta V_{TH} = -Q_{FG}/C_{CF} \quad (3)$$

In data erasing, since control gate 200, drain 220 and substrate 240 are grounded and a high voltage $V_{PP}$ is applied to source 230, the following relationships $V_C=V_C=V_D=0V$, $V_S=V_{PP}$ are satisfied in the above equation (1). Thus, potential $V_{FC}$ on the floating gate is expressed in the following equation using coupling ratio $k_C$ and threshold variation $\Delta V_{TH}$ according to the above equations (1) to (3).

$$V_{FG} = C_X V_{PP}/C_{TOTAL} - k_C \Delta V_{TH} \quad (4)$$

Accordingly, the potential difference between floating gate 210 and source 230 is expressed by the following equation.

$$(1 - C_S/C_{TOTAL})V_{PP} + k_C \Delta V_{TH} \quad (5)$$

The magnitude of the electric field induced between floating gate 210 and source 230 is proportional to the potential difference between floating gate 210 and source 230 and is inversely proportional to the thickness of oxide film 250 formed between floating gate 210 and source 230. Accordingly, if the thickness of the oxide film between floating gate 210 and substrate 240 is 100 Å, threshold variation $\Delta V_{TH}$ is 5V, coupling ratio $k_C$ is 0.6, the value of $C_S/C_{TOTAL}$ is 0.1, and high voltage $V_{PP}$ is 12V, then the magnitude of the electric field is 13.8 MV/cm. That is, a very strong electric field of 13.8 MV/cm is induced at the oxide film between floating gate 210 and source 230 in data erasing. This strong electric field causes a tunnel phenomenon, so that the electrons are drawn out from floating gate 210.

In general, in order to cause a tunnel phenomenon for drawing the electrons stored in floating gate 210 into source 230, an electric field of 10 MV/cm or more may be induced at oxide film 250 formed between floating gate 210 and source 230. However, at present, an external power source which drives a semiconductor apparatus and provides a highest voltage second to 5V is a power source of 12V.

In a flash EEPROM, since the total amount of current flowing through bit lines in data writing is approximately 1–5 mA, it is difficult to generate a high voltage for data writing within chips. More specifically, when a high voltage is generated within the chips, a high voltage generating circuit such as a charge pump for providing a high voltage by time-sequentially charging a plurality of capacitors is employed. However, such a high voltage generating circuit cannot supply currents of 1–5mA required for data writing. The magnitude I of a current which can be supplied by the charge pump is evaluated by a product of a capacitance value C of a capacitor in use and a charging frequency f of the capacitor. For example, even if capacitance value C is 10 pF and charging frequency f is 10 MHz, supply current I of the charge pump is as small as 100 μA. Thus, a high voltage required for data erasing and data writing must be supplied from an external power source.

For the above reasons, a high voltage of 12V is used in data erasing at present. Consequently, such an excessively strong electric field (13.8 MV/cm) as described above occurs at oxide film 250 between floating gate 210 and source 230 in data erasing, leading to a higher liability for excess erase.

Further, when a gate voltage is 0V in an N channel MOS transistor, an inter-band tunneling phenomenon occurs in an overlapping region of a gate and a drain diffusion region. This phenomenon also occurs in an overlapping region of the gate and a source diffusion region when a source potential is high. The inter-band tunneling occurs when the surface of N type drain and source diffusion regions is in a deep depletion state since the gate voltage is 0V. If the surface of these N type diffusion regions is in the deep depletion state, then an energy band at the boundary between a substrate and an oxide film beneath the gate curves sharply. Thus, electrons of a valence electron band tunnel to a conduction band in the N type diffusion regions. Holes generated at this time flow into the grounded substrate, while the electrons that have tunneled to the conduction band are focused into the N type diffusion regions. A current generated by the flow of the holes into the substrate becomes a leakage current of this N channel MOS transistor. In data erasing, since a high voltage is applied to source 230 of the memory transistor and control gate 200 is thus grounded, such an inter-band tunneling phenomenon occurs.

Referring again to FIG. 9, it is known that the inter-band tunneling phenomenon occurs at a portion 260 in the vicinity of source 230 at an interface between substrate 240 and oxide film 250, in data erasing. Since substrate 240 is grounded, the holes generated by this phenomenon flow as a leakage current to the substrate 240 side, and the electrons that have tunneled to the conduction band flow to the source 230 side together with the electrons drawn out from floating gate 210. The inter-band tunneling phenomenon in the flash EEPROM is described in the article entitled "Subbreakdown Drain Leakage Current in MOSFET", IEEE Electron Device lett., vol. EDL-8, 1987, pp. 515–517 by J. Chen et al., and the article entitled "A FLASH-ERASE EEPROM CELL WITH AN ASYMMETRIC SOURCE AND DRAIN STRUCTURE", IEEE Tech. Dig. of IEDM 1987, 25. 8, pp. 560–563 by H. Kume et al. According to these documents, a leakage current generated by the inter-band tunneling phenomenon is approximately $10^{-8}$A for one memory transistor when the potential of source 230 is approximately 10V. Accordingly, in the case of a 1M bit flash EEPROM, if high voltage pulses of 10V are applied to source 230 for data erasing, then a leakage current generated in data erasing is 10 mA. This leakage current causes such various problems as heat generation of chips due to an increase in power consumption, and a decrease in supply voltage. In general, the tolerance of such a leakage current is several 10 mA or less. However, with the capacity of semiconductor apparatus having been increased in recent years, the number of memory transistors of a flash EEPROM has been increased, and the capacity of the flash EEPROM has also been increased up to approximately 16M bit at present. In the case of a 16M bit flash EEPROM, for example, if data erasing is carried out in response to high voltage pulses of 10V, then a leakage current developed in data erasing is 10 mA × 16, i.e., 160 mA, the value largely exceeding the tolerance. Since a voltage to be applied to source 230 for data erasing is 12V in practice, the actual magnitude of the leakage current is further larger than that value. In such a circumstance, the leakage current generated in data erasing should be reduced as much as possible.

As has been described heretofore, the conventional flash EEPROM repeats the cycle in which the erase pulse having a short pulse width is first applied to the memory array, and then the erase verifying is carried out, in order to prevent an excess erase. Thus, if the memory cell, in which data is not completely erased, is detected by the erase verifying operation, the erase pulse is again applied to all the memory cells in the memory array. Accordingly, the erase pulses applied again to the memory array serve to remove the electrons stored in the floating gate in data writing in the memory transistor, in which data is not yet completely erased. Conversely, the applied erase pulses serve to draw out the electrons originally existing in the floating gate therefrom in the memory transistor, in which data is already completely erased. Consequently, when the data erasing is completed with respect to memory cells in which data is less easily erased, an excess erase occurs in memory cells in which data is easily erased.

Larger the differences in ease of data erasing between the memory cells constituting the memory array are, larger the differences in the number of erase pulses required for a complete erase of data between the memory cells constituting memory array 1 are. There is a case where the erase pulses, which are again applied so as to completely erase the data of the memory cell detected by erase verifying, cannot perform a complete data erase with respect to the memory cell, in which data is less easily erased than the detected memory cell. In this case, the erase pulses are again applied to all the memory cells in the memory array at the time when the memory cell, in which data is less easily erased, is detected by the next erase verifying operation. Therefore, as there are larger differences in ease of data erasing between the memory cells constituting the memory array, the number of the erase pulses applied to the memory array before the data erasing is completed with respect to the memory cell, in which data is least easily erased (i.e., before the data of all the memory cells in the memory array are completely erased) increases. Thus, it is highly possible that an excess erase occurs in many memory cells when the erasing operation is completed.

The differences in ease of data erasing between the memory cells constituting one memory array are due to various factors in the manufacture and the circuit configuration of the device, as described above. Such differences increase with an increase in the number of memory cells constituting one memory array. Therefore, a recent increase in the capacity of semiconductor memory devices, i.e., an increase in the number of bits makes the foregoing disadvantage more significant.

SUMMARY OF THE INVENTION

One object of the present invention is to provide a nonvolatile semiconductor memory device in which an excess erase is less liable to occur.

Another object of the present invention is to provide a nonvolatile semiconductor memory device in which small power consumption is required in data erasing.

A further object of the present invention is to provide a nonvolatile semiconductor memory device in which a leakage current generated by an inter-band channeling phenomenon in memory cells is reduced in data erasing.

A still further object of the present invention is to provide a nonvolatile semiconductor memory device in which there is a small difference in ease of a data erase between a plurality of memory cells to which erase pulses are simultaneously applied.

A still further object of the present invention is to provide a nonvolatile semiconductor memory device in which there are a small number of all erase pulses to be applied to a memory array until data of all memory cells in the memory array are completely erased.

A still further object of the present invention is to provide a nonvolatile semiconductor memory device in which an excess erase is less liable to occur in memory cells by repetitive application of erase pulses and repetitive erase verifying.

A still further object of the present invention is to provide a nonvolatile semiconductor memory device in which small power consumption is required in data erasing and an excess erase is less liable to occur.

In order to accomplish the foregoing objects, a nonvolatile semiconductor memory device in accordance with the present invention includes: a memory cell array including a plurality of memory cells each having field effect semiconductor elements which enable data writing by utilizing avalanche breakdown and data erasing by utilizing a tunnel phenomenon; voltage lowering circuitry for lowering an externally applied predetermined high voltage in a range sufficient to cause a tunnel phenomenon; and circuitry for applying an output of the voltage lowering circuitry to the memory cells in order erase data stored in each of the memory cells.

Since the nonvolatile semiconductor memory device in accordance with the present invention is thus structured, the externally applied predetermined high voltage is not directly applied as a voltage for data erasing to the memory cells, but applied as a voltage for data erasing to the memory cells after lowered by the voltage lowering circuitry. Thus, the intensity of an electric field which is applied so as to cause a tunnel phenomenon in the field effect semiconductor elements constituting the memory cells is decreased, in data erasing, as compared with the conventional.

Preferably, the voltage lowering circuitry includes an electric path through which an externally applied predetermined high voltage is transmitted to the application circuitry, a comparator for comparing a predetermined reference voltage lower than the predetermined high voltage with the voltage transmitted from the electric path to the application circuitry, and electric path controlling circuitry responsive to an output of the comparator for controlling the electric path.

The electric path includes, for example, a first P channel MOS transistor having a source for receiving the predetermined high voltage, a drain connected to the application circuitry, and a gate. The comparator includes an operational amplifier having an inversion input terminal for receiving the reference voltage, a non-inversion input terminal connected to the drain, and an output terminal connected to the gate.

The operational amplifier includes, for example, a differential amplifier circuit including two parallel-connected series connection circuits each having a second P channel MOS transistor and an N channel MOS transistor between a constant-current source and a predetermined high voltage. A potential on a connection point between the second P channel MOS transistor and the N channel MOS transistor in one of those series connection circuits is applied to the gate of the first P channel transistor, while a drain potential of the first P channel transistor is applied to a gate of the N channel transistor in the other series connection circuit. A reference voltage is applied to a gate of the N channel transistor in the one series connection circuit.

More preferably, the memory cell array is divided into at least first and second blocks. The application circuitry includes first high voltage applying circuitry, second high voltage applying circuitry, reading circuitry and controlling circuitry.

In a data erase mode, the first high voltage applying circuitry collectively applies high voltage lowered by the voltage lowering circuitry to all memory cells included in the first block. In the data erase mode, the second high voltage applying circuitry collectively applies high voltage lowered by the voltage lowering circuitry to all memory cells included in the second block. In the data erase mode, the reading circuitry simultaneously or sequentially reads storage data of the memory cells included in the first block and storage data of the memory cells included in the second block. The controlling circuitry controls the first and second high voltage applying circuitry to be individually enabled or disabled in response to data read by the reading circuitry.

The controlling circuitry includes: first controlling circuitry for controlling the first high voltage applying circuitry to be enabled or disabled in response to the reading of the data from all the memory cells included in the first block by the reading circuitry; and second controlling circuitry for controlling the second high voltage applying circuitry to be enabled or disabled in response to the reading of the data from all the memory cells included in the second block by the reading circuitry.

The first high voltage applying circuitry includes, for example, high voltage pulse generating circuitry for outputting the high voltages lowered by the voltage lowering circuitry for a predetermined short period in response to each of completion of the data reading from all the memory cells in the first block by the reading circuitry and completion of the data reading from the memory cells in the second block by the reading circuitry, in the data erase mode; and a first electric path through which an output of the high voltage pulse generating circuitry is transmitted to all the memory cells included in the first block.

Similarly, the second high voltage applying circuitry includes; for example, the high voltage pulse generating circuitry; and a second electric path through which the output of the high voltage pulse generating circuitry is transmitted to all the memory cells included in the second block. In this case, the first controlling circuitry includes, for example, first enable signal generating circuitry responsive to the data read from each of the memory cells in the first block by the reading circuitry for detecting that a data erase for that memory cell is incomplete, to generate a first enable signal for enabling the first high voltage applying circuitry; a first latch circuit for storing the first enable signal generated by the first enable signal generating circuitry until the data are read from all the memory cells in the first block by the reading circuitry; and first activating circuitry for activating the first electric path in response to the first enable signal stored in the first latch circuit and the high voltage output by the high voltage pulse generating circuitry. Similarly, the second controlling circuitry includes, for example, second enable signal generating circuitry responsive to data read from each of the memory cells in the second block by the reading circuitry for detecting that a data erase for that memory cell is incomplete, to generate a second enable signal for enabling the second high voltage applying circuitry; a second latch circuit for storing therein the second enable signal generated by the second enable signal generating circuitry until the data are read from all the memory cells in the second block by the second reading circuitry; and second activating circuitry for activating the second electric path in response to the second enable signal stored in the second latch circuit and the high voltage output by the high voltage pulse generating circuitry.

The first activating circuitry includes, for example, a first inverter provided between an output of the high voltage pulse generating circuitry and ground for receiving as an input an output of the first latch circuit; and the second activating circuitry includes a second inverter provided between the output of the high voltage pulse generating circuitry and ground for receiving as an input an output of the second latch circuit. Similarly, the first electric path includes, for example, a first switching element provided between the output of the high voltage pulse generating circuitry and all the memory cells in the first block and controlled in response to an output of the first inverter; and the second electric path includes a second switching element provided between the output of the high voltage pulse generating circuitry and all the memory cells in the second block and controlled in response to an output of the second inverter.

When the memory cell array is thus divided into the first and second blocks, preferably, the reading circuitry includes an address counter for generating an internal address signal from each of the first and second blocks irrespective of an external address signal, and circuitry responsive to the internal address signal generated by the address counter for selecting one memory cell from each of the first and second blocks. The first controlling circuitry further includes first internal address controlling circuitry for controlling the address counter to update the internal address signal in response to a storage signal of the first latch circuit, provided when the data reading from the memory cells in the first block by the reading circuitry is completed, being not the first enable signal; and the second controlling circuitry further includes second internal address controlling circuitry for controlling the address counter so as to update the internal address signal in response to a storage signal of the second latch circuit, provided when the data reading from the memory cells in the second block is completed, being not the second enable signal.

As described above, according to a preferred embodiment, a memory cell array is divided into first and second blocks, and a circuit for applying erase pulses to memory cells and a circuit for erase verifying are provided for each of the first and second blocks. These circuits provided corresponding to the first block and the ones provided corresponding to the second block operate independently. Thus, erase pulses can selectively be applied only to a block including a memory cell in which a data erase is incomplete. Accordingly, the difference in easiness of data erase between a plurality of memory cells to which erase pulses are simultaneously applied becomes small, and the number of all erase pulses which are applied to each memory cell until a data erase for all the memory cells in the memory cell array is completed, decreases in average. Therefore, an excess erase is avoided more efficiently according to this preferred embodiment.

In accordance with the present invention, since a voltage applied to the source of a memory transistor in data erasing becomes smaller as compared with the conventional, a leakage current generated by an interband tunneling phenomenon caused in the vicinity of the source of the memory transistor in data erasing is reduced. Thus, a current to be consumed in data erasing is substantially reduced as compared with the conventional. At the same time, the intensity of an electric field applied across the floating gate and the source of the memory transistor in data erasing is reduced as compared with the conventional, leading to a lower liability for an excess erase. In addition, erase pulses are less liable to be applied to a memory cell in which data erasing is completed, a period before the data erase for all the memory cells is completed. Those effects enable a data erase in which a current is less consumed and an excess erase is less liable to occur.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is an operation flow chart for use in explaining an operation of the flash EEPROM of FIG. 2 in an erase mode;

DESCRIPTION OF THE PREFERRED EMBODIMENTS

Figure 1:
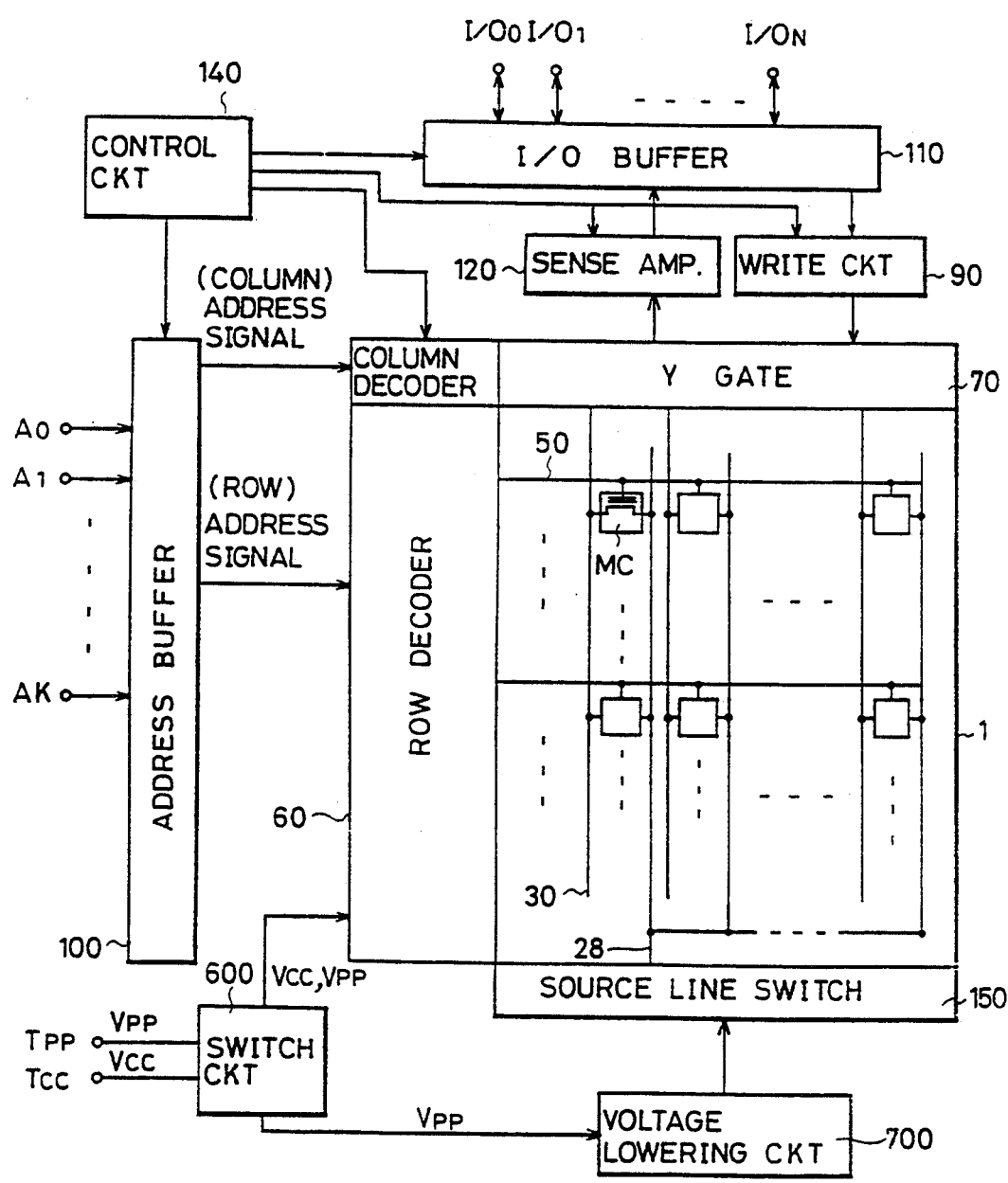
FIG. 1 is a schematic block diagram showing the structure of a major portion of a flash EEPROM according to one embodiment of the present invention.
Figure 7:
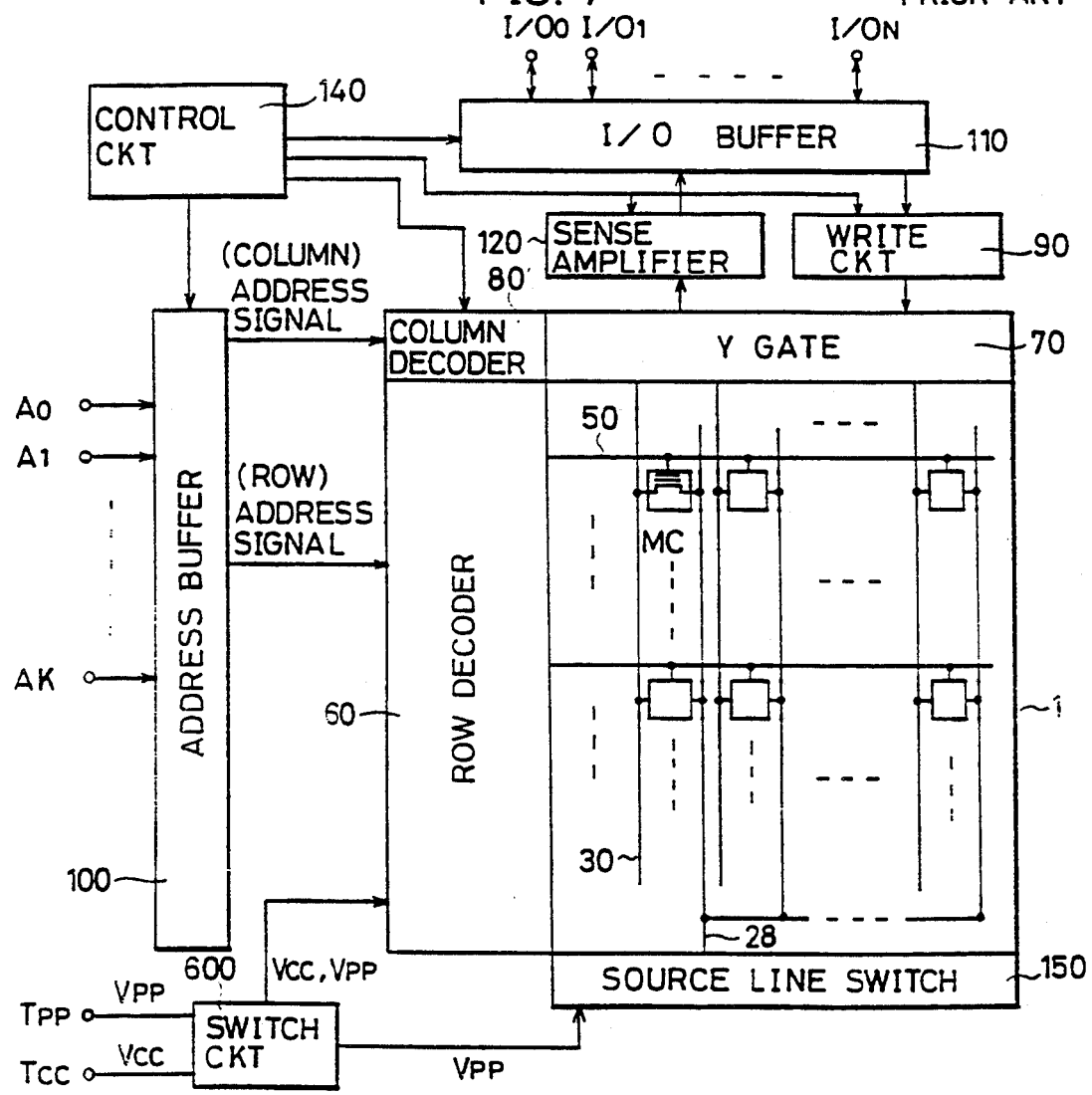
FIG. 7 is a partial schematic block diagram of a conventional flash EEPROM.

FIG. 1 is a schematic block diagram showing the structure of a major portion of a flash EEPROM according to one embodiment of the present invention, Referring to FIG. 1, this flash EEPROM includes a voltage lowering circuit 700 for lowering a high voltage $V_{PP}$ applied to a terminal $T_{PP}$ unlike the conventional flash EEPROM shown in FIG. 7. Terminal $T_{PP}$ is supplied with, for example, a 12V DC voltage as high voltage $V_{PP}$. A terminal $T_{CC}$ is externally supplied with a supply voltage $V_{CC}$ like the conventional. Supply voltage $V_{CC}$ is, for example, 5V lower than high voltage $V_{PP}$.

A switch circuit 600 is controlled by a control circuit 140 to apply high voltage $V_{PP}$ from terminal $T_{PP}$ to a row decoder 60 in data writing. Switch circuit 600 is controlled by control circuit 140 to apply supply voltage $V_{CC}$ to row decoder 60 in data reading. Further, switch circuit 600 is controlled by control circuit 140 to apply high voltage $V_{PP}$ to voltage lowering circuit 700 in data erasing. Voltage lowering circuit 700 lowers high voltage $V_{PP}$ applied from switch circuit 600 to approximately 9V to apply the lowered voltage to a source line switch 150.

Figure 8:
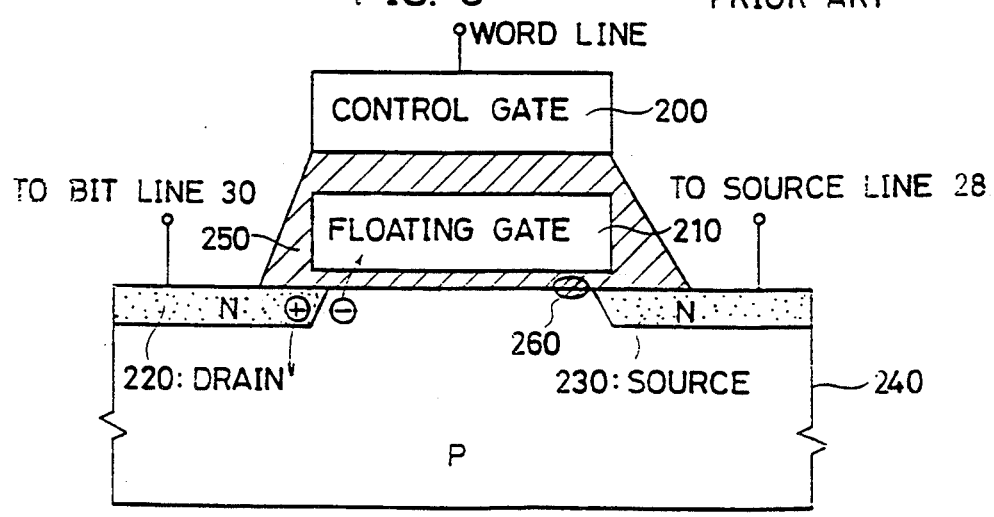
FIG. 8 is a cross-sectional view showing the structure of memory cells according to a conventional example and an embodiment.
Figure 9:
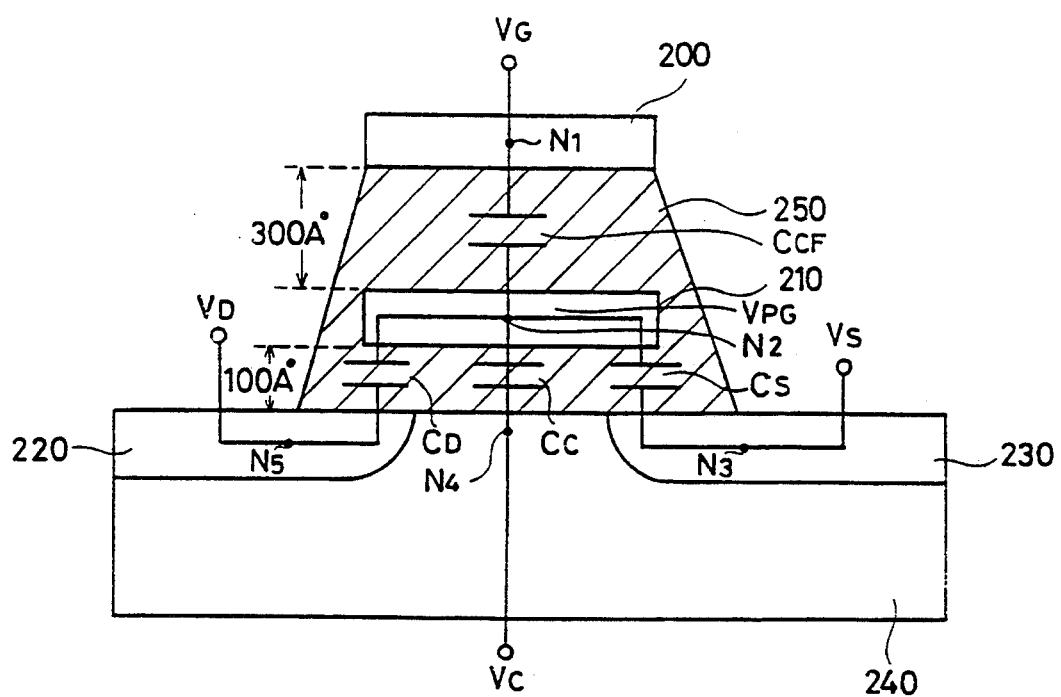
FIG. 9 is an equivalent circuit diagram showing a capacitance coupling relationship in a memory transistor.

The structure and operation of other portions of this flash EEPROM than switch circuit 600 and voltage lowering circuit 700 is the same as that in the conventional flash EEPROM shown in FIG. 7. In this embodiment, however, a voltage lowered by voltage lowering circuit 700 is applied to source line switch 150. Thus, a 9V voltage lower than the conventional voltage is applied as erase pulses to a source line 28 in data erasing. A word line 50 is grounded by row decoder 60. Accordingly, with reference to FIG. 8, the potential difference between a floating gate 210 and a source 230 in a memory transistor to which erase pulses are applied decreases in response to a decrease in source potential $V_S(=V_{PP})$ (see the equation (5)).

It is now assumed that the thickness of an oxide film 250 formed between floating gate 210 and a substrate 240 is 100 Å; a variation $\Delta V_{TH}$ of a threshold voltage caused by charges stored in floating gate 210 is 5V; a coupling ratio $k_C$ is 0.6; and a ratio $C_S/C_{TOTAL}$ of a capacitance $C_S$ across floating gate 210 and source 230 to a total capacitance $C_{TOTAL}$ across a control gate 200, floating gate 210, a drain 220, source 230 and substrate 240 is 0.1. In this case, if source potential $V_S$ is 9V, then the intensity of an electric field applied to oxide film 250 between floating gate 210 and source 230 is approximately 11.1 MV/cm according to the equation (5). In the conventional flash EEPROM, a high voltage of 12V is applied as erase pulses to source 230. Thus, when a data erase is carried out under the same conditions, an electric field of 13.8 MV/cm is induced at oxide film 250 between floating gate 210 and source 230 in data erasing. According to this embodiment, however, the intensity of the electric field applied to oxide film 250 is substantially reduced within a range in which a tunnel phenomenon occurs between floating gate 210 and source 230.

Accordingly, such an excess erase is less liable to occur because conventionally the electric field between floating gate 210 and source 230 in erase pulse application is excessively strong. In addition, as disclosed in the above-described documents, it is known that in a range in which source potential $V_S$ is lower than or equal to approximately 10V in data erasing, a leakage current generated by an inter-band tunneling decreases by one order of magnitude in response to only a 1V decrease. Since a leakage current in one memory transistor is approximately $10^{-8}$A in data erasing as described above, the leakage current is reduced to approximately $10^{-9}$A in this embodiment. Thus, if the capacity of this flash EEPROM is e.g., 1Mbit, the leakage current in data erasing is approximately 1 mA. If the capacity is 16 Mbit, then the leakage current is approximately 16 mA. As described above, the leakage current in data erasing is substantially reduced to a value within a tolerance of several 10 mA. Accordingly, the present invention becomes more effective when applied to a large capacity flash EEPROM.

The magnitude of a voltage lowered by voltage lowering circuit 700 is not limited to 9V, but must be in a range in which a tunnel phenomenon for data erasing can occur between floating gate 210 and source 230. However, if the voltage lowered by voltage lowering circuit 700 can not induce an electric field having such an intensity that the tunnel phenomenon can occur between floating gate 210 and source 230 in a memory transistor of the conventional structured several values with respect to the structure of the memory transistor may be adjusted. More specifically, the thickness of oxide film 250 formed between floating gate 210 and substrate 240, variation $\Delta V_{TH}$ of a threshold voltage viewed from control gate 200, coupling ratio $k_C$, ratio $C_S/C_{TOTAL}$ and the like may be adjusted to respective values at which a tunnel phenomenon occurs between floating gate 210 and source 230 when the lowered voltage is applied to source 230. Those values are adjustable by changes in impurity concentration, impurity-implanted depth or the like at drain 220, source 230 and P type substrate 240. Specifically, the intensification of an electric field within oxide film 250 between floating gate 210 and source 230 in data erasing can be achieved by, for example, a decrease in the thickness of oxide film 250 formed beneath floating gate 210.

While the structure of the flash EEPROM is shown in the case where no erase verifying is carried out in the foregoing embodiment, the present invention may be applied to a flash EEPROM of such a structure that data of all memory cells in memory array 1 are erased by repetitions of erase pulse application and erase verifying. In this case, the voltage lowered by voltage lowering circuit 700 may be applied as erase pulses with a shorter pulse width to memory array 1 and, after that, data may be read from the memory cells in memory array 1 for performing erase verifying.

In the foregoing embodiment, it is difficult to sufficiently eliminate an excess erase which is caused by the difference in ease of data erasing between any memory cells MC in memory array 1. Thus, in order to eliminate such excess erase caused by the differences between the memory cells, an effective approach can be made in such a structure that an externally applied high voltage $V_{PP}$ is lowered by voltage lowering circuit 700 and also memory array 1 is divided into a plurality of blocks, each of which erase pulses are individually applied tot FIG. 2 is a schematic block diagram showing a major portion of a flash EEPROM of such a structure.

Figure 2:
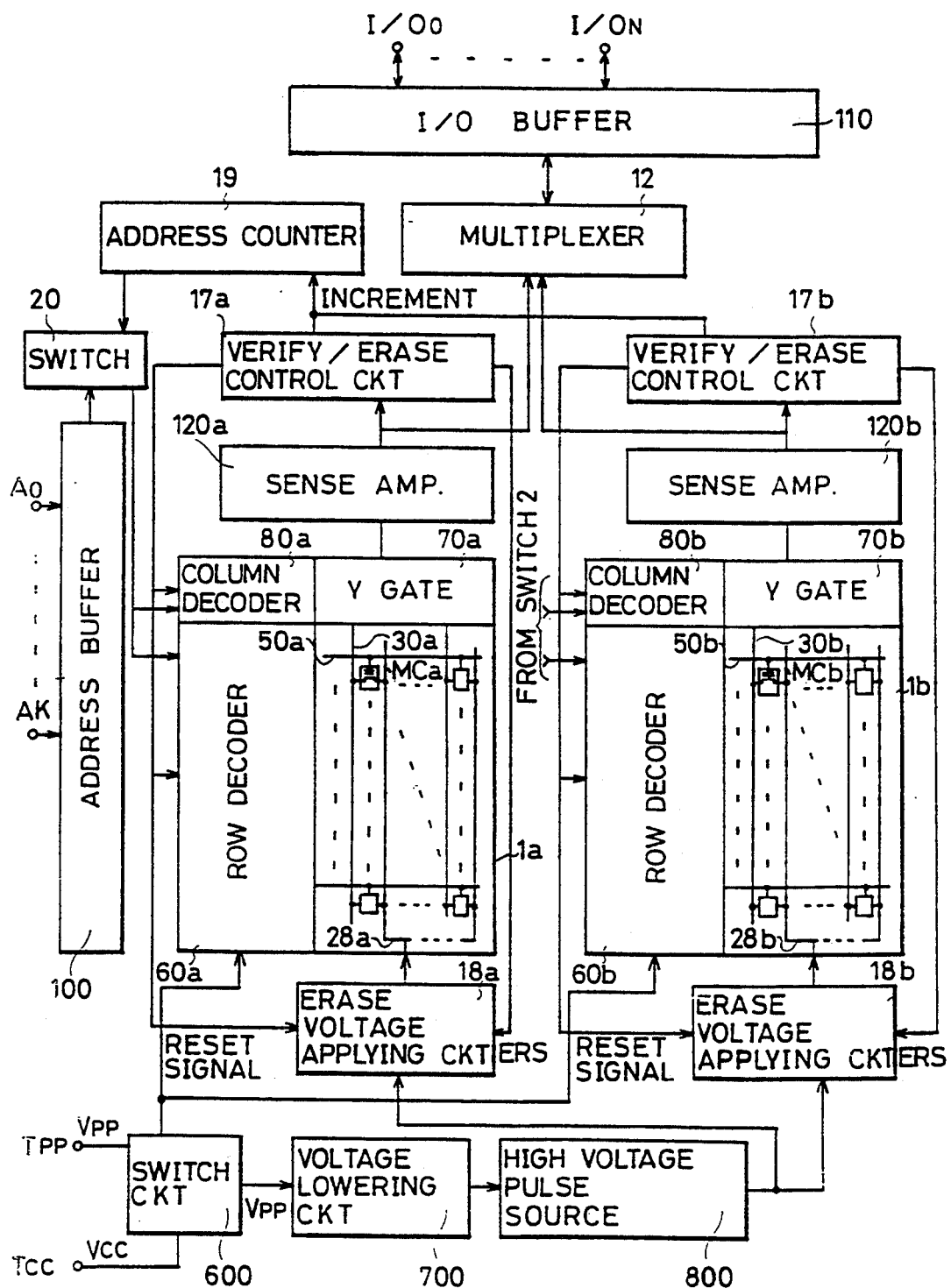
FIG. 2 is a schematic block diagram showing the structure of a flash EEPROM according to another embodiment of the present invention.

Referring to FIG. 2, the operation of a switch circuit 600 and voltage lowering circuit 700 is identical to that in the flash EEPROM of FIG. 1. More specifically, switch circuit 600 applies a high voltage $V_{PP}$ to row decoders 60a and 60b in data writing and a supply voltage $V_{CC}$ to row decoders 60a and 60b in data reading. Further, switch circuit 600 applies high voltage $V_{PP}$ to voltage lowering circuit 700 in data erasing. Voltage lowering circuit 700 lowers applied high voltage $V_{PP}$ to a predetermined voltage to apply the lowered voltage to a high voltage pulse source 800 at a succeeding stage.

This flash EEPROM includes a memory array divided into two subarrays 1a and 1b. A row decoder 60a, a Y gate 70a, a column decoder 80a, a sense amplifier 120a, a verifying/erasing control circuit 17a and an erase voltage applying circuit 18a are provided corresponding to memory array 1a. Similarly, a row decoder 60b, a Y gate 70b, a column decoder 80b, a sense amplifier 120b, a verifying/erasing control circuit 17b and an erase voltage applying circuit 18b are provided corresponding to memory array 1b.

Each of memory arrays 1a and 1b has the same configuration as the conventional. More specifically, in memory array 1a, memory cells MCa each constituted by FAMOS transistors are arranged in matrix in the directions of rows and columns along word lines 50a and bit lines 30a. The transistors each constituting all the memory cells MCa in memory array 1a have their respective sources commonly connected to a source line 28a. Each transistor constituting each memory cell MCa has its control gate and its drain connected to a corresponding word line 50a and corresponding bit line 30a, respectively. Similarly, in memory array 1b, memory cells MCb each constituted by FAMOS transistors are arranged in matrix in the directions of rows and columns along word lines 50b and bit lines 30b. The transistors each constituting all memory cells MCb in memory array 1b have their respective sources commonly connected to a source line 28b. Each memory cell MCb has its control gate and its drain connected to a corresponding word line 50b and corresponding bit line 30b, respectively. The structure of memory cells MCa and MCb is identical to that shown in FIG. 8. Therefore, also in the flash EEPROM according to this embodiment, a data erasing can be carried out by application of high voltage pulses to source lines 28a and 28b and by grounding of word lines 50a and 50b.

Since the operation of row decoder 60a, Y gate 70a, column decoder 80a and sense amplifier 120a for data reading from memory array 1a is the same as the conventional, a description thereof will not be repeated here. Similarly, since the operation of row decoder 60b, Y gate 70b, column decoder 80b and sense amplifier 120b for data reading from memory array 1b is the same as the conventional; a description thereof will not be repeated, either.

In addition to the foregoing circuitry, this flash EEPROM includes a multiplexer 12, an address buffer 100, an input/output buffer 110, an address counter 19 and a switch circuit 20.

Address buffer 100 is connected with external address terminals A0–AK. Input/output buffer 110 is connected with external input/output terminals $I/O_0-I/O_N$. In normal data writing, address buffer 100 accepts externally applied address signals through address terminals A0–AK to apply the same to switch circuit 20. Input/output buffer 110 accepts externally applied input data through FIG. 15 input/output terminals $I/O_0-I/O_N$ in normal data writing and provides output data such as read data from memory arrays 1a and 1b through input/output terminals $I/O_0-I/O_N$ in normal data reading. In normal data reading, multiplexer 12 selectively applies one of output data of sense amplifier 120a and output data of sense amplifier 120b to input/output buffer 110. Accordingly, only read data from one of memory arrays 1a and 1b is output through input/output terminals $I/O_0-I/O_N$.

Figure 5:
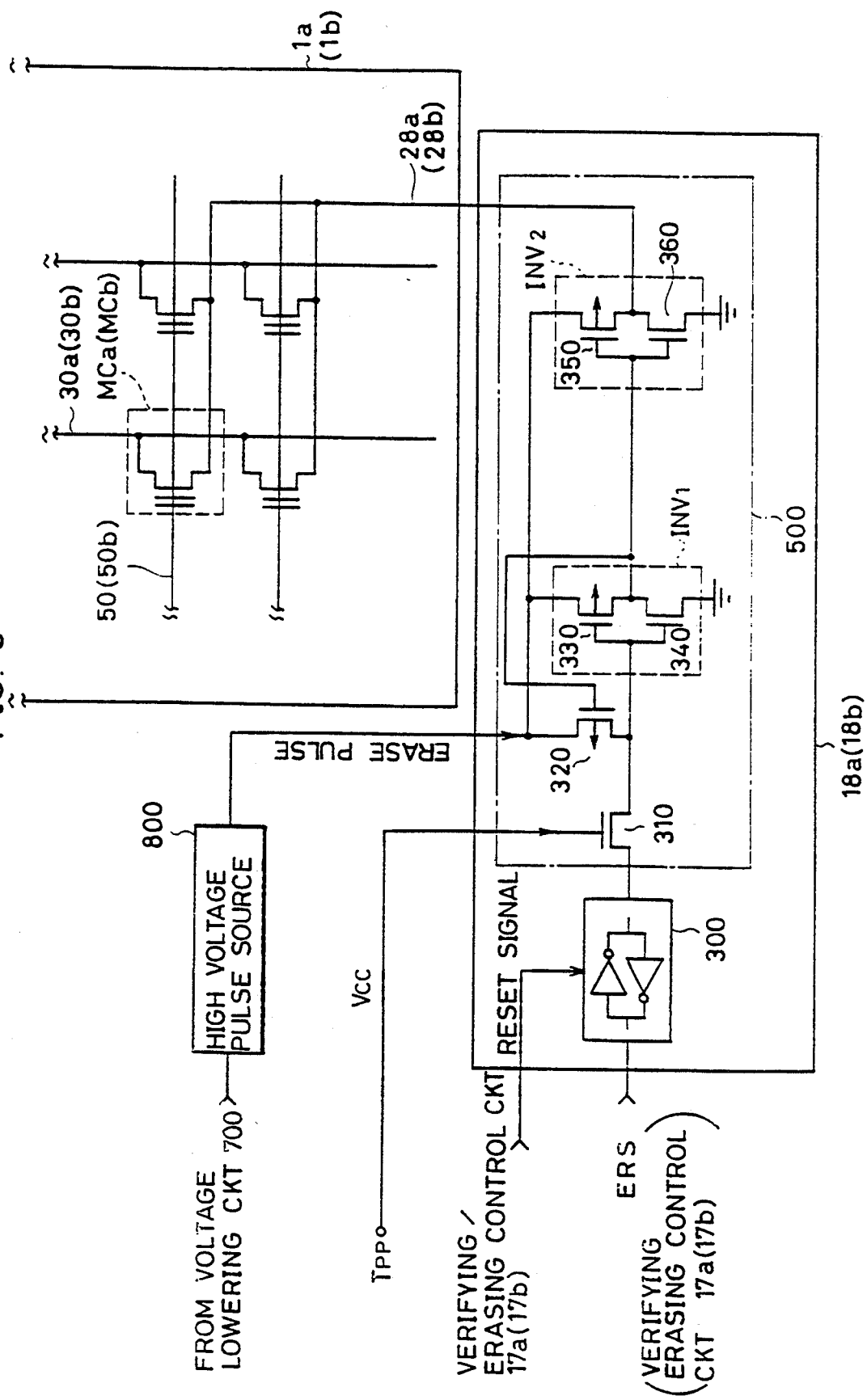
FIG. 5 is a circuit diagram showing a detailed example of the configuration of an erase voltage applying circuit of FIG. 2.

A detailed description will now be given of an operation of this flash EEPROM in a data erase mode, with reference to FIGS. 2, 5 and 6. FIG. 5 is a circuit diagram showing one example of a specific configuration of erase voltage applying circuits 18a and 18b. FIG. 6 is an operation flow chart showing the flow of the operation of the flash EEPROM in the erase mode.

When the flash EEPROM enters in the erase mode, multiplexer 12, address buffer 100 and input/output buffer 110 are inactivated, whereas address counter 19 is activated. The activated address counter 19 can generate an address signal by a counting operation. The address signal generated from address counter 19 is applied to switch circuit 20. In the erase mode, switch circuit 20 applies an output of address counter 19 from those of address counter 19 and address buffer 100 selectively to row decoders 60a and 60b and column decoders 80a and 80b. When a count value of address counter 19 indicates the maximum value, the address signal output from address counter 19 indicates final addresses of memory arrays 1a and In the erase mode, a cycle in which verifying/erasing control circuits 17a and 17b supply high voltage pulses as erase pulses to erase voltage applying circuits 18a and 18b, respectively (hereinafter referred to as erase cycle) and a cycle in which verifying/erasing control circuits 17a and 17b carry out erase verifying for memory arrays 1a and 1b, respectively (hereinafter referred to as erase verify cycle) are repeated.

In the erase verify cycle, switch circuit 600 supplies a supply voltage $V_{CC}$ from a terminal $T_{CC}$ to row decoder 60a. In the erase cycle, switch circuit 600 supplies a high voltage $V_{PP}$ from a terminal $T_{PP}$ to voltage lowering circuit 700.

In the erase verify cycle, verifying/erasing control circuit 17a controls row decoder 60a and column decoder 80a so that they may operate the same as in normal data reading. Accordingly, row decoder 60a responds to an applied address signal to supply a supply voltage $V_{CC}$ of a logical high level from switch circuit 600 to only a single word line of word lines 50a in memory array 1a. Column decoder 80a responds to an applied address signal to electrically connect only a single bit line of bit lines 30a in memory array 1a to sense amplifier 120a. Similarly, verifying/erasing control circuit. 17b controls row decoder 60b and column decoder 80b so that they may operate the same as in normal data reading. Accordingly, row decoder 60b responds to an applied address signal to selectively supply a voltage of a logical high level to only a single word line of word lines 50b in memory array 1b. Column decoder 80b responds to an applied address signal to electrically connect only a single bit line of bit lines 30b in memory array 1b to sense amplifier 120b. At the same time, verifying/erasing control circuits 17a and 17b each control erase voltage applying circuits 18a and 18b so that high voltage pulses may not be output from erase voltage applying circuits 18a and 18b.

Each of erase voltage applying circuits 18a and 18b has the configuration shown in FIG. 5, for example. Referring to FIG. 5, each of erase voltage applying circuits 18a and 18b includes a latch circuit 300 and a high voltage switch 500. High voltage switch 500 includes an N channel MOS transistor 310 for receiving a supply voltage 5V at its gate, P channel MOS transistors 320, 330 and 350, and N channel MOS transistors 340 and 360. Transistors 330 and 340 are connected in series between high voltage pulse source 800 and ground, to constitute an inverter INV1. Similarly, transistors 350 and 360 are connected in series between high voltage pulse source 800 and ground, to constitute an inverter INV2. Transistor 320 is connected between high voltage pulse source 800 and an input terminal of inverter INV1. Transistor 320 has its gate connected to an output terminal of inverter INV1. Transistor 310 is connected between an output terminal of latch circuit 300 and the input terminal of inverter INV1. Inverter INV2 is connected between the output terminal of inverter INV1 and source line 28a (28b) of memory array 1a (1b). Transistor 310 cuts the high voltage applied to high voltage switch 500 so as to prevent the high voltage from being transmitted to latch circuit 300.

Latch circuit 300 latches a data signal applied from verifying/erasing control circuit 17a (17b) of FIG. 2. Further, latch circuit 300 is configured to reset latch data to "0" in response to an external reset signal. In the erase cycle, high voltage pulse source 800 converts a high voltage ($<V_{PP}$) lowered by voltage lowering circuit 700 into a high voltage pulse having a shorter pulse width, to supply the high voltage pulse as an erase pulse, whereas in the erase verify cycled high voltage pulse source 700 supplies a normal supply voltage as an output. In this embodiment, latch circuit 300 is supplied with a reset signal from verifying/erasing control circuit 17a (17b) at the beginning of the erase verify cycle.

Accordingly, an output voltage of latch circuit 300 attains a logical low level corresponding to a logic value "0" (operation step S3 of FIG. 6). Since transistor 310 is constantly in an ON state with its gate receiving supply voltage 5V, the voltage of a logical low level supplied from latch circuit 300 renders transistor 330 of inverter INV1 conductive. As a result, a voltage of a logical high level supplied from high voltage pulse source 800 is supplied to the output terminal of inverter INV1. This voltage of the output terminal of inverter INV1 is inverted into a ground voltage of a logic low level by inverter INV2 and then supplied to source line 28a (28b). That is, source line 28a (28b) is grounded.

In the case where erase voltage applying circuits 18a and 18b are structured as shown in FIG. 5, if latch circuit 300 is reset by its corresponding verifying/erasing control circuit 17a or 17b at the beginning of the erase verify cycle, source lines 28a and 28b are grounded and do not attain a high potential.

The above-described circuit operation causes data to be simultaneously read from memory arrays 1a and 1b in the erase verify cycle. The data read from memory array 1a is sensed by sense amplifier 120a to be applied to verifying/erasing control circuit 17a. Similarly, the data read from memory array 1b is sensed by sense amplifier 120b to be applied to verifying/erasing control circuit 17b. Verifying/erasing control circuit 17a determines whether or not the read data applied from sense amplifier 120a is "1" corresponding to the state where electrons are completely removed from a floating gate.

More specifically, referring to FIG. 6, in the erase verify cycle, data is read from memory array 1a (operation step S4). Then, a determination is made based on the read data as to whether or not data erasing is completed in the memory cell selected at present (operation step S5). If the read data is "0", a determination can be made that the data erasing is incomplete in the presently selected memory cell. In this case, verifying/erasing control circuit 17a generates a data signal ERS of a logical high level so as to set data "1" in latch circuit 300 (see FIG. 5) in erase voltage applying circuit 18a (operation step S6). Verifying/erasing control circuit 17a then supplies as an output a signal for incrementing a count value of address counter 19. Thus, the count value of address counter 19 is incremented, so that an address signal generated from address counter 19 is incremented (operation step S7). If the read data is "1", a determination is made that the data erasing is completed with respect to the presently selected memory cell, so that verifying/erasing control circuit 17a outputs no data signal ERS.

If the count value of address counter 19 is already the maximum value, and hence the count value cannot be incremented more by the increment in operation step S7, a data reading operation in the erase verify cycle ends (operation step S8). If the count value of address counter 19 has not reached the maximum value yet (if a determination output of operation step S8 is "No"), however, the address signal is updated by this increment. In this case, verifying/erasing control circuit 17a successively controls row decoder 60a and column decoder 80a so as to achieve the data reading from memory array 1a. Accordingly, storage data of a memory cell corresponding to an address indicated by the updated address signal is read out from memory array 1a. Verifying/erasing control circuit 17a determines based on this newly read data whether or not the presently selected memory cell has a defect in data erasing. In response to a result of this determination, the circuit 17a either sets data "1" in latch circuit 300 in erase voltage applying circuit 18a or holds latch circuit 300 in a reset state. That is, a series of circuit operations for erase verifying with respect to the memory cell of the updated address, i.e., operation steps S4–S6 of FIG. 6 are carried out. Thereafter, the address signal generated from address counter 19 is further incremented by verifying/erasing control circuit 17a (operation step If the count value of address counter 19 can further be incremented by this increment, then the circuit operation shown in operation steps S4–S8 is again repeated, so that erase verifying is carried out with respect to the memory cell of the address indicated by the incremented address signal.

As described above, in the erase verify cycle, the circuit operation in which data is read from one address and then the data "1" is set in latch circuit 300 in erase voltage applying circuit 18a only when the read data indicates a defect in data erase is repeated. Verifying/erasing control circuit 17b also performs the same operation as verifying/erasing control circuit 17a. The count value of address counter 19 is reset in response to this flash EEPROM entering in the erase mode (operation step S1 of FIG. 6). If the count value of address counter 19 is kept incremented to the maximum value until the address signal indicates a final address, then a checking of the presence/absence of a data erase defect in all memory cells $MC_a$ and $MC_b$ in memory arrays 1a and 1b is completed.

In the erase verify cycle, when verifying/erasing control circuit 17a detects a memory cell having a data erase defect in memory array 1a, data "1" is set in latch circuit 300 in erase voltage applying circuit 18a at this time. Latch circuit 300 keeps holding applied data as long as no reset signal is externally applied. Thus, if there is even one memory cell with a data erase defect in memory array 1a, latch data of latch circuit 300 in erase voltage applying circuit 18a is "1" at the time when all memory cells $MC_a$ in memory array 1a are already checked. Conversely, if there is no memory cell with a data erase defect in memory array 1a, no signal ERS is output even once from verifying/erasing control circuit 17a in the erase verify cycle. Thus, in this case, the latch data of latch circuit 300 in erase voltage applying circuit 18a remains to be "0" at the time when all memory cells $MC_a$ in memory array 1a have been checked.

Similarly, if there is even one memory cell with a data erase defect in memory array 1b, verifying/erasing control circuit 17b supplies as an output a data signal ERS of a logic high level. Conversely, if there is no memory cell with a data erase defect in memory array 1b, verifying/erasing control circuit 17b generates no signal ERS in the erase verify cycle. Accordingly, at the time when all memory cells $MC_b$ in memory array 1b have already been checked, the latch data of latch circuit 300 in erase voltage applying circuit 18b is "1" when a data-erase defective memory cell exists in memory array 1b and "0" when no data-erase defective memory cell exists therein.

Therefore, if the count value of address counter 19 is incremented to the maximum value, and the circuit operation in operation steps S3–S8 of FIG. 6 is completed, then data "1" is set in only latch circuit 300 in the erase voltage applying circuit corresponding to the memory array, in which the data-erase defective memory cell exists.

When the count value of address counter 19 is incremented to the maximum value, and all memory cells $MC_a$ and $MC_b$ in memory arrays 1a and 1b are all checked, this flash EEPROM moves to the erase cycle. In the erase cycle, verifying/erasing control circuit 17a controls row decoder 60a so that row decoder 60a may supply a ground potential to all word lines 50a in memory array 1a. At the same time, verifying/erasing control circuit 17b also controls row decoder 60b so that row decoder 60b may supply the ground potential to all word lines 50b in memory array 1b. Accordingly, a ground potential of a logic low level is supplied to the control gate of the transistor constituting each of all memory cells $MC_a$ and $MC_b$ in memory arrays 1a and 1b.

With reference to FIG. 5, if latch circuit 300 in erase voltage applying circuit 18a is set in the data "1" at this time, an output voltage of latch circuit 300 is at a logic high level. Thus, this logic high level voltage causes transistor 340 in inverter INV1 to be turned on and thus causes the output terminal of inverter INV1 to be of the ground potential. This ground potential causes transistor 350 in inverter INV2 to be turned on and thus causes an output of high voltage pulse source 800 to be transmitted to the output terminal of inverter INV2. Transistor 320 is turned on in response to the potential on the output terminal of inverter INV1 received at its gate, so that a potential on the input terminal of inverter INV1 is fixed at a logical high level in response to the output of high voltage pulse source 800. This insures a supply of the output of high voltage pulse source 800 to the output terminal of inverter INV2. In the erase cycle, high voltage pulse source 800 generates high voltage pulses of a high potential much higher than a normal supply voltage 5V. Therefore, if the data "1" is set in latch circuit 300 in erase voltage applying circuit 18a, a high voltage pulse is applied from inverter INV2 onto source line 28a in memory array 1a in the erase cycle. If the data "1" is not set in latch circuit 300 in erase voltage applying circuit 18a, however, an output voltage of latch circuit 300 remains at a logical low level, so that source line 28a remains to be grounded via transistor 360 in inverter INV2. Thus, the high voltage pulse is applied to source line 28a in memory array 1a in the erase cycle as far as the data "1" is set in latch circuit 300 in erase voltage applying circuit 18a. That is, erase pulses are applied to all memory cells $MC_a$ in memory array 1a as far as a data-erase defective memory cell exists in memory array 1a.

Similarly, if the data "1" is set in latch circuit 300 in erase voltage applying circuit 18b, an erase pulse generated from high voltage pulse source 800 is applied to source line 28b in memory array 1b via transistor 350 in erase voltage applying circuit 18b. Conversely, if the data "1" is not set in latch circuit 300 in erase voltage applying circuit 18b, source line 28b in memory array 1b remains to be grounded via transistor 360 in erase voltage applying circuit 18b. Thus, erase pulses are applied from erase voltage applying circuit 18b to all memory cells $MC_b$ in memory array 1b as far as a data-erase defective memory cell exists in memory array 1b.

As described above, when all memory cells $MC_a$ and $MC_b$ in memory arrays 1a and 1b are already checked, erase pulses are selectively applied to memory array 1a dependently on whether or not the data "1" is set in latch circuit 300 in erase voltage applying circuit 18a, and erase pulses are selectively applied to memory array 1b dependently on whether or not the data "1" is set in latch circuit 300 in erase voltage applying circuit 18b (operation steps S9 and S2 in FIG. 6). If the data "1" is set in neither latch circuit 300 in erase voltage applying circuit 18a nor 18b, a determination can be made that a data-erase defective memory cell exists neither in memory array 1a nor 1b. Thus, all the operations in the data erase mode of the flash EEPROM are completed when limited in this case.

If the data "1" is set in latch circuit 300 in at least one of erase voltage applying circuits 18a and 18b, so that erase pulses are applied to at least one of memory arrays 1a and 1b (operation step S2), then the flash EEPROM again enters in the erase verify cycle and in the subsequent erase cycle. That is, the circuit operation corresponding to processing steps S3-S9 and S2 in FIG. 6 restarts. Unlike the conventional, however, the erase pulses generated after erase verifying are applied only to the memory array including a data-erase defective memory cell. Thus, since no erase pulses are applied to the memory array including only a memory cell in which a data erase is already completed, the number of memory cells, in which an excess erase is caused by re-application of erase pulses, is reduced to a smaller number than the conventional.

The circuit operation corresponding to operation steps S2-S9 is repeated until a data-erase defective memory cell no longer exists in any of memory arrays 1a and 1b.

The differences in ease of data erasing between the memory cells in each memory array become smaller by division of one memory array into two memory arrays 1a and 1b. Thus, the excess erase is less liable to occur in each of memory arrays 1a and 1b. Accordingly, the liability of occurrence of the excess erase in the memory cells in memory arrays 1a and 1b after the completion of the circuit operation in the erase mode of the flash EEPROM is substantially reduced as compared to the conventional.

Figure 3:
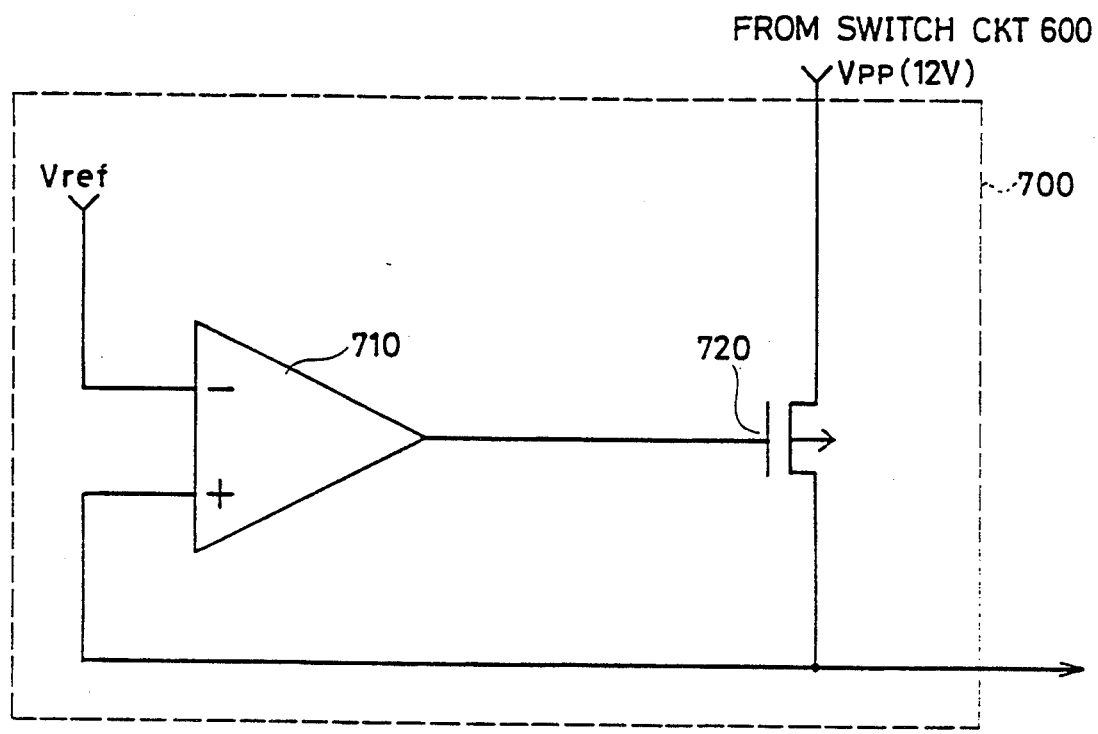
FIG. 3 is a circuit diagram showing one detailed example of the configuration of a voltage lowering circuit of FIGS. 1 and 2.

FIG. 3 is a circuit diagram showing one example of the configuration of voltage lowering circuit 700. Referring to FIG. 3, voltage lowering circuit 700 includes a comparator 710 constituted by, for example, an operational amplifier for receiving a reference voltage Vref ($<V_{PP}$) at its inversion input terminal, and a P channel MOS transistor 720 having its gate connected to an output terminal of comparator 710. Transistor 720 is provided between an output terminal of switch circuit 600 and a noninversion input terminal of comparator 710.

When transistor 720 is rendered conductive in response to an output of comparator 710, a high voltage $V_{PP}$ from switch circuit 600 is applied to the noninversion input terminal of comparator 710. Comparator 710 supplies a logic high level voltage to the gate of transistor 720 if the voltage applied to the noninversion input terminal is higher than reference voltage Vref, while it supplies a logic low level voltage to the gate of transistor 720 if the voltage applied to the noninversion input terminal is lower than reference voltage Vref. Accordingly, when high voltage $V_{PP}$ is applied to the noninversion input terminal of comparator 710, an output level of comparator 710 is a logic high level. As a result, transistor 720 is turned off, so that high voltage $V_{PP}$ from switch circuit 600 is cut by transistor 720. Thus, a voltage at the noninversion input terminal of comparator 710 is maintained at a constant level lower than high voltage $V_{PP}$. This voltage at the noninversion input terminal of comparator 710 is applied as a lowered voltage to source line switch 150 of FIG. 1 and high voltage pulse source 800 of FIG. 2.

Figure 4:
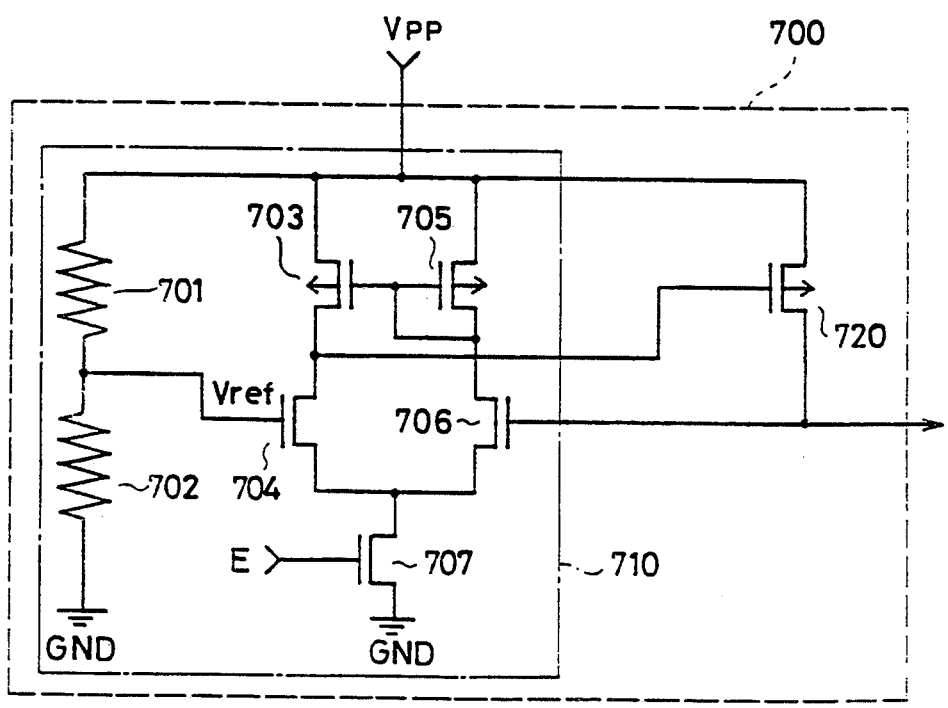
FIG. 4 is a circuit diagram showing one example of a detailed structure of a comparator of FIG. 3.

FIG. 4 is a circuit diagram showing one example of a detailed structure of comparator 710 of FIG. 3. Referring to FIG. 4, comparator 710 includes resistors 701 and 702 connected in series between an output terminal of switch circuit 600 and ground GND, P channel MOS transistors 703 and 705 constituting a differential amplifier, and N channel MOS transistors 704, 706 and 707.

A high voltage $V_{PP}$ from switch circuit 600 is divided into a voltage which is determined based on a resistance ratio of resistors 701 and 702, and then the divided voltage is applied to a gate of transistor 704. This causes the gate of transistor 704 to be fixed at a reference potential Vref. Transistor 707 receives a constant voltage E at its gate to flow a constant current at ground GND. When a voltage higher than a gate voltage of transistor 704 is applied to a gate of transistor 706, transistor 704 is rendered nonconductive and transistor 706 is rendered conductive. When transistor 706 is turned on, a potential on a connecting point between transistors 705 and 706 falls, so that transistors 703 and 705 are rendered conductive. Since transistor 704 is nonconductive, a potential on a connecting point between transistors 703 and 704 increases when transistor 703 is rendered conductive. Thus, transistor 720 which has its gate receiving the potential on the connecting point between transistors 703 and 704 is rendered nonconductive. If a gate voltage of transistor 706 becomes lower than reference voltage Vref, transistor 704 is turned on conversely to the foregoing cased so that transistors 703 and 705 are turned off. As a result, the potential on the connecting point between transistors 703 and 704 falls, so that transistor 720 is rendered conductive. Accordingly, the gate of transistor 706 is again charged in response to high voltage $V_{PP}$, however, when the gate voltage thereof becomes higher than reference voltage Vref, the above-described circuit operation is performed. More specifically, if the gate voltage of transistor 706 becomes higher than reference voltage Vref, then transistor 720 is turned off in response to the raise in the potential on the connecting point between transistors 703 and 704. High voltage $V_{PP}$ from switch circuit 600 is lowered to a constant voltage of approximately equal to reference voltage Vref by the ON/OFF operation of transistor 720.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:
a memory cell array including a plurality of electrically erasable and programmable memory cells,
each of said electrically erasable and programmable memory cells having a source electrode, a drain electrode, a floating gate, and a control gate,
each of said memory cells enabling erasure of data by drawing out from the floating gate the electrons stored therein through the source electrode by a tunnel phenomenon;

means for lowering an externally applied predetermined high voltage in a sufficient range in which said tunnel phenomenon occurs; and means for applying an output of said voltage lowering means to said source electrodes of said memory cells in order to erase data stored in each of said memory cells.

2. A nonvolatile semiconductor memory device comprising:

a memory cell array having at least first and second blocks, each block including a plurality of electrically erasable and programmable memory cells, voltage lowering means for lowering an externally applied predetermined high voltage in sufficient range in which a tunnel phenomenon occurs in said electrically erasable and programmable memory cells in a data erase mode, first high voltage applying means for collectively applying high voltage lowered by said voltage lowering means to all of said electrically erasable and programmable memory cells included in said first block in said data erase mode, and second high voltage applying means for collectively applying the high voltage lowered by said voltage lowering means to all of said memory cells included in said second block in said data erase mode;

means for reading storage data of said memory cells included in said first and second blocks in said data erase mode; and means responsive to the data read by said reading means for controlling said first and second high voltage applying means to be individually enabled or disabled.

3. The nonvolatile semiconductor memory device according to claim 2, wherein said reading means comprises:

first reading means responsive to completion of the application of the high voltages from said first high voltage applying means to said all memory cells included in said first block for serially reading data from said memory cells included in said first block, and second reading means responsive to completion of the application of the high voltages from said second high voltage applying means to said all memory cells included in said second block for serially reading data from said memory cells included in said second block.

4. The nonvolatile semiconductor memory device according to claim 3, wherein said control means comprises:

first control means responsive to the reading of the data from said all memory cells included in said first block by said first reading means for controlling said first high voltage applying means to be enabled or disabled, and second control means responsive to the reading of the data from said all memory cells included in said second block by said second reading means for controlling said second block by said second reading means for controlling said second high voltage applying means to be enabled or disabled.

5. The nonvolatile semiconductor memory device according to claim 4, wherein said first high voltage applying means comprises:

first high voltage pulse generating means for outputting the high voltages lowered by said voltage lowering means for a predetermined short period in response to each of the completion of the data reading from said memory cells included in said first block by said first reading means and the completion of the data reading from said memory cells included in said second block by said second reading means, and first electric path means for transmitting an output of said high voltage pulse generating means to said all memory cells included in said first block; and said second high voltage applying means comprises:

said high voltage pulse generating means, and second electric path means for transmitting the output of said high voltage pulse generating means to said all memory cells included in said second block.

6. The nonvolatile semiconductor memory device according to claim 5, wherein said first control means comprises:

first enable signal generating means responsive to the data read from each said memory cell in said first block by said first reading means for detecting that a data erase is incomplete with respect to each said memory cell, to generate a first enable signal for enabling said first high voltage applying means, first storage means for storing said first enable signal generated by said first enable signal generating means until the data are read from said all memory cells in said first block by said first reading means, and first activating means for activating said first electric path means in response to said first enable signal stored in said first storage means and said high voltages output by said high voltage pulse generating means; and said second control means comprises second enable signal generating means responsive to the data read from each said memory cell in said second block by said second reading means for detecting that a data erase is incomplete with respect to each said memory cell, to generate a second enable signal for enabling said second high voltage applying means, second storage means for storing said second enable signal generated by said second enable signal generating means until the data are read from said all memory cells in said second block by said second reading means, and second activating means for activating said second electric path means in response to said second enable signal stored in said second storage means and said high voltages output by said high voltage pulse generating means.

7. The nonvolatile semiconductor memory device according to claim 6, wherein said first and second storage means each include a latch circuit having two inverters connected in reverse parallel.

8. The nonvolatile semiconductor memory device according to claim 7, wherein said first activating means comprises first inverter means for receiving as an input an output of said first storage means and provided between an output of said high voltage pulse generating means and ground;

said second activating means comprises second inverter means for receiving as an input an output of said second storage means and provided between the output of said high voltage pulse generating means and said ground;

said first electric path means comprises a first switching element having a conduction state thereof controlled in response to an output of said first inverter means and provided between the output of said high voltage pulse generating means and said all memory cells in said first block; and said second electric path means comprises a second switching element having a conduction state thereof controlled in response to an output of said second inverter means and provided between the output of said high voltage pulse generating means and said all memory cells in said second block.

9. The nonvolatile semiconductor memory device according to claim 3, wherein timing of reading data from said memory cells in said first block by said first reading means coincides with timing of reading data from said memory cells in said second block by said second reading means.

10. The nonvolatile semiconductor memory device according to claim 3, wherein timing of reading data from said memory cells in said first block by said first reading means does not coincide with timing of reading data from said memory cells in said second block by said second reading means.

11. The nonvolatile semiconductor memory device according to claim 6, wherein said reading means comprises:
  means for generating an internal address signal for selecting a memory cell from which data is to be read, from each of said first and second blocks independently of an external address signal, and
  means responsive to said internal address signal generated by said internal address generating means for selecting one memory cell from each of said first and second blocks.

12. The nonvolatile semiconductor memory device according to claim 11, wherein said first control means further comprises first internal address control means for controlling said internal address generating means to update said internal address signal in response to a storage signal of said first storage means; and said second control means further comprises second internal address control means for controlling said internal address generating means so as to update said internal address signal in response to a storage signal of said second storage means.

13. A nonvolatile semiconductor memory device comprising:

a memory cell array including a plurality of electrically erasable and programmable memory cells, voltage lowering means including;
  (a) an output node,
  (b) electric path means for transmitting an externally applied predetermined high voltage to said output node,
  (c) means for making a comparison between a predetermined reference voltage lower than said predetermined high voltage and a voltage appearing at said output node and for controlling said electric path means using said comparison, and means for applying the voltage appearing at the output node of said voltage lowering means to said memory cell in order to erase data stored in said memory cell.

14. A nonvolatile semiconductor memory array, comprising:

a plurality of electrically erasable and programmable memory cells, voltage lowering means including:
  (a) an output node,
  (b) a field effect semiconductor element having a first conduction terminal for receiving an externally applied predetermined high voltage, a second conduction terminal connected to said output node, and a control terminal; and
  (c) operational amplifier means having a first input terminal for receiving a predetermined reference voltage lower than said predetermined high voltage, a second input terminal connected to said output node, and an output terminal connected to said control terminal of said field effect semiconductor element, and means for applying the voltage appearing at the output node of said voltage lowering means to said memory cell in order to erase data stored in said memory cell.

15. The nonvolatile semiconductor memory device according to claim 14, wherein said first field effect semiconductor element has a polarity of P type;

said first input terminal comprises an inversion input terminal; and said second input terminal comprises a noninversion input terminal 16. The nonvolatile semiconductor memory device according to claim 14, wherein said operation amplifier means comprises means for differentially amplifying said reference voltage and the voltage appearing at the output node.

17. The nonvolatile semiconductor memory device according to claim 16, wherein said differential amplifier means includes
  a constant current source, and
  first and second circuit element means provided in parallel to each other between said constant current source and said predetermined high voltage,
  said first and second circuit element means each including second and third field effect semiconductor elements having different polarities and connected in series, wherein
  said second field effect semiconductor element included in said first circuit element means has a control terminal for receiving said reference voltage;
a connection point of said second and third field effect semiconductor elements included in said first circuit element means is connected to said control terminal of said first field effect semiconductor element; and
said second field effect semiconductor element included in said second circuit element means has a control terminal connected to said second conduction terminal of said first field effect semiconductor element.

18. The nonvolatile semiconductor memory device according to claim 17, wherein said second field effect semiconductor element and said third field effect semiconductor element have a P type polarity and an N type polarity, respectively.

19. A nonvolatile semiconductor memory device, comprising:
a first supply terminal to which a first supply voltage is applied;
a second supply terminal to which a ground potential is applied;
a memory cell array including a plurality of electrically erasable and programmable memory cells, each electrically erasable and programmable memory cell having a source electrode, a drain electrode connected to a corresponding bit line, a floating gate, and a control gate connected to a corresponding word line;
means for applying to the control gate of said electrically erasable and programmable memory cell the first supply voltage applied to said first supply terminal at the time of data writing, and
means, having voltage converting means receiving the first supply voltage applied to said first supply terminal for converting the received first supply voltage into a second voltage having an intermediate value between the received first supply voltage and the ground voltage applied to said second supply terminal, for applying the second voltage from said voltage converting means to said source electrode of said electrically erasable and programmable memory cell so that a tunnel phenomenon occurs in a gate insulating film located beneath said floating gate when electrons stored in the floating gate of said electrically erasable and programmable memory cell are drawn out to said source electrode of said cell.

20. A nonvolatile semiconductor memory device, comprising:
a plurality of electrically erasable and programmable memory cells, each electrically erasable and programmable memory cell having a source electrode, a drain electrode, and a floating gate;
erasing voltage applying means for applying a predetermined voltage to the source electrode of said plurality of electrically erasable and programmable memory cells to be erased, said erasing voltage applying means including temporarily storing means receiving a set signal and a reset signal and providing an erase mode signal in response to the set signal and not providing erase mode signal in response to the reset signal and an output from said temporarily storing means and responsive to the erase mode signal from said temporarily storing means for applying said predetermined voltage as received to the source electrode of said plurality of electrically erasable and programmable memory cells; and
controlling means for providing said set signal to the temporarily storing means in said erasing voltage applying means when there exist electrically erasable and programmable memory cells in an unerased state as a result of reading the data stored in said plurality of electrically erasable and programmable memory cells after data erase mode when data stored in said plurality of electrically erasable and programmable memory cells are erased during a predetermined period.

21. The device of claim 20, wherein said switching means comprises:
an input circuit having a first input responsive to the output of said temporarily storing means for supplying said erase mode signal, and a second input receiving said predetermined voltage,
disabling means responsive to said first and second inputs for preventing said predetermined voltage from being supplied to said source electrodes of the memory cells when said erase mode signal is not supplied.

22. The device of claim 21, wherein said disabling means comprises first inverting means conductive when said erase mode signal is not supplied to form a high output level corresponding to said predetermined voltage and second inverting means responsive to said first inverting means for inverting said high output level into a low level supplied to said source electrodes.

23. The device of claim 22, wherein said first inverting means comprises first and second FET devices connected in series so as to have control electrodes responsive to said first input, an input electrode of the first FET device responsive to said predetermined voltage, and output electrodes coupled to said second inverting means.

24. The device of claim 23, wherein said first FET device is conductive when said erase mode signal is not supplied.

25. A nonvolatile semiconductor memory device, comprising:
a memory cell array having a plurality of blocks, each block including a plurality or electrically erasable and programmable memory cells, each electrically erasable and programmable memory cell having a source electrode, a drain electrode and a floating gate;
a plurality of erasing voltage applying means provided corresponding to said plurality of blocks for applying a predetermined voltage to the source electrode of said plurality of electrically erasable and programmable memory cells when the data stored in plurality of electrically erasable and programmable memory cells in the corresponding block are to be erased, each of the erasing voltage applying means including temporarily storing means receiving a set signal and a reset signal and providing an erase mode signal in response to the set signal and not providing said erase mode signal in response to the reset signal, and switching means receiving said predetermined voltage and an output from said temporarily storing means and responsive to the erase mode signal from said temporarily storing means for applying said predetermined voltage as received to the source electrode of said plurality of electrically erasable and programmable memory cells; and
controlling means for providing a set signal to the temporarily storing means of said erasing voltage applying means corresponding to the block in which there exist electrically erasable and programmable memory cells in an unerased state as a result of reading the data stored in said plurality of electrically erasable and programmable memory cells after data erase mode in which data stored in said plurality of electrically erasable and programmable memory cells in said each block is erased during a predetermined time period.

26. A nonvolatile semiconductor memory device recited in claim 25 wherein said controlling means comprises a plurality of controlling sections corresponding to said plurality of blocks, respectively.

27. The device of claim 25, wherein said switching means comprises:
an input circuit having a first input responsive to the output of said temporarily storing means for supplying said erase mode signal, and a second input receiving said predetermined voltage,
disabling means responsive to said first and second inputs for preventing said predetermined voltage from being supplied to said source electrodes of the memory cells when said erase mode signal is not supplied.

28. The device of claim 27, wherein said disabling means comprises first inverting means conductive when said erase mode signal is not supplied to form a high output level corresponding to said predetermined voltage and second inverting means responsive to said first inverting means for inverting said high output level into a low level supplied to said source electrodes.

29. The device of claim 28, wherein said first inverting means comprises first and second FET devices connected in series so as to have control electrodes responsive to said first input, an input electrode of the first FET device responsive to said predetermined voltage, and output electrodes coupled to said second inverting means.

30. The device of claim 29, wherein said first FET device is conductive when said erase mode signal is not supplied.

31. A nonvolatile semiconductor memory device, comprising:
a plurality of electrically erasable and programmable memory cells, each electrically erasable and programmable memory cell having a pair of main electrodes and a floating gate;
erasing voltage applying means for applying a predetermined voltage to one of said pair of main electrodes in said plurality of electrically erasable and programmable memory cells when electrons stored in the floating gate of said electrically erasable and programmable memory cells are drawn out, said erasing voltage applying means including temporarily storing means receiving a set signal and a reset signal and providing a predetermined voltage generating signal in response to the set signal and not providing said predetermined voltage generating signal in response to the reset signal, and switching means receiving said predetermined voltage and output from said temporarily storing means for applying said predetermined voltage as received to one of the pair of main electrodes of said plurality of electrically erasable and programmable memory cells; and
controlling means for providing said set signal to the temporarily storing means of said erasing voltage applying means when electrons stored in the floating gates of said electrically erasable and programmable memory cells are insufficiently drawn out as a result of reading data stored in said plurality of electrically erasable and programmable memory cells after data stored in said plurality of electrically erasable and programmable memory cells has been drawn out during a predetermined period.

32. The device of claim 31, wherein said switching means comprises:
an input circuit having a first input responsive to the output of said temporarily storing means for supplying said predetermined voltage generating signal, and a second input receiving said predetermined voltage, and
disabling means responsive to said first and second inputs for preventing said predetermined voltage from being supplied to said main electrodes of the memory cells when said predetermined voltage generating signal is not supplied.

33. The device of claim 32, wherein said disabling means comprises first inverting means conductive when said predetermined voltage generating signal is not supplied to form a high output level corresponding to said predetermined voltage and second inverting means responsive to said first inverting means for inverting said high output level into a low level supplied to said main electrodes.

34. The device of claim 33, wherein said first inverting means comprises first and second FET devices connected in series so as to have control electrodes responsive to said first input, an input electrode of the first FET device responsive to said predetermined voltage, and output electrodes coupled to said second inverting means.

35. The device of claim 34, wherein said first FET device is conductive when said predetermined voltage generating signal is not supplied.

36. A nonvolatile semiconductor memory device, comprising:
a memory cell array having a plurality of blocks, each block including a plurality of electrically erasable and programmable memory cells, each electrically erasable and programmable memory cell having a pair of main electrodes and a floating gate;
a plurality of erasing voltage applying means provided corresponding to said plurality of blocks for applying a predetermined voltage to one of the pair of main electrodes of said plurality of electrically erasable and programmable memory cells when electrons stored in the floating gate of the plurality of electrically erasable and programmable memory cells to cause electrons stored in the floating gate of the plurality of in the corresponding block to be drawn out, each of the erasing voltage applying means including temporarily storing means receiving a set signal and a reset signal and providing a predetermined voltage generating signal in response to the set signal and not providing said predetermined voltage generating signal in response to the reset signal, and switching means receiving said predetermined voltage and an output from said temporarily storing means and responsive to the predetermined voltage generating signal from said temporarily storing means for applying said predetermined voltage as received to one of the pair of main source electrodes of said plurality of electrically erasable and programmable memory cells; and
controlling means for providing a set signal to the temporarily storing means of said erasing voltage applying means corresponding to the block in which electrons stored in the floating gate of the electrically erasable and programmable memory cells have been insufficiently drawn out as a result of reading the data stored in said plurality of electrically erasable and programmable memory cells after electrons stored in said plurality of electrically erasable and programmable memory cells in said each block were drawn out during a predetermined time period.

* * * * *